United States Patent
Chen et al.

(10) Patent No.: US 11,990,086 B2
(45) Date of Patent: May 21, 2024

(54) DISPLAY APPARATUS AND ELECTRONIC DEVICE

(71) Applicant: GUANGDONG OPPO MOBILE TELECOMMUNICATIONS CORP., LTD., Dongguan (CN)

(72) Inventors: Biao Chen, Dongguan (CN); Shilin Yuan, Dongguan (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 17/722,990

(22) Filed: Apr. 18, 2022

(65) Prior Publication Data

US 2022/0238071 A1 Jul. 28, 2022

Related U.S. Application Data

(63) Continuation of application No. PCT/CN2020/122515, filed on Oct. 21, 2020.

(30) Foreign Application Priority Data

Oct. 31, 2019 (CN) .......................... 201911049482.9
Oct. 31, 2019 (CN) .......................... 201921866090.7

(51) Int. Cl.
G09G 3/3225 (2016.01)

(52) U.S. Cl.
CPC ... *G09G 3/3225* (2013.01); *G09G 2300/0439* (2013.01); *G09G 2310/0232* (2013.01)

(58) Field of Classification Search
CPC ......... G09G 3/3225; G09G 2300/0439; G09G 2310/0232; G09G 3/3233;
(Continued)

(56) References Cited

U.S. PATENT DOCUMENTS

2016/0293679 A1   10/2016   Xu et al.
2019/0108793 A1*   4/2019   Kim ..................... G09G 3/3233
(Continued)

FOREIGN PATENT DOCUMENTS

CN   107610635 A   1/2018
CN   108983872 A   12/2018
(Continued)

OTHER PUBLICATIONS

The supplementary European search report dated Jan. 11, 2023 from European patent application No. 20882902.8.
(Continued)

*Primary Examiner* — Adam R. Giesy
(74) *Attorney, Agent, or Firm* — BAYES PLLC

(57) ABSTRACT

A display apparatus and an electronic device are disclosed. The display apparatus comprises a first display region and a second display region adjacent to each other, wherein the second display region comprises a plurality of regular-shape first pixel sets and at least one second pixel set conformal to an edge of the second display region, and the second pixel set is adjacent to the first display region; and each first pixel set comprises a first number of second pixels connected in parallel, each second pixel set comprises a second number of second pixels connected in parallel, and the second number is less than the first number.

19 Claims, 12 Drawing Sheets

(58) Field of Classification Search
CPC ... G09G 2300/0426; G09G 2300/0804; G09G 2340/0407; G09G 3/3216; G09G 2300/0465; G09G 2300/08; H10K 59/35; H10K 59/65; H10K 59/60
See application file for complete search history.

(56) References Cited

U.S. PATENT DOCUMENTS

| | | | |
|---|---|---|---|
| 2021/0217821 | A1 | 7/2021 | Han et al. |
| 2021/0265430 | A1* | 8/2021 | Chang .................. H10K 59/353 |

FOREIGN PATENT DOCUMENTS

| | | |
|---|---|---|
| CN | 208607570 U | 3/2019 |
| CN | 109584794 A | 4/2019 |
| CN | 109599052 A | 4/2019 |
| CN | 110047386 A | 7/2019 |
| CN | 110061014 A | 7/2019 |
| CN | 209070895 U | 7/2019 |
| CN | 110112176 A | 8/2019 |
| CN | 110189639 A | 8/2019 |
| CN | 209265332 U | 8/2019 |
| CN | 110278300 A | 9/2019 |
| CN | 110288945 A | 9/2019 |
| CN | 110391254 A | 10/2019 |
| CN | 110599944 A | 12/2019 |
| CN | 210516182 U | 5/2020 |
| KR | 20160003993 A | 1/2016 |

OTHER PUBLICATIONS

International Search Report dated Feb. 20, 2021 from PCT Application No. PCT/CN2020/122515, 15 pages.
Notice of Allowance dated Apr. 9, 2020 from CN Application No. 201921866090.7, 5 pages.
The First Examination Report dated Oct. 13, 2022 from Indian Application No. 202227027562.
The partial supplementary European Search Report dated Sep. 9, 2022 from European Application No. 20882902.8.
Notice of Reasons for Rejection dated May 9, 2023 from related Japanese Application No. 2022-525556.
Notice of Reason for Rejection dated Jul. 17, 2023 from related Korean Application No. 10-2022-7017552.
The First Office Action dated Mar. 1, 2024 from Chinese patent application No. 201911049482.9.

* cited by examiner

DISPLAY APPARATUS AND ELECTRONIC DEVICE

CROSS REFERENCE TO RELATED APPLICATION

This application is a continuation of International Application No. PCT/CN2020/122515, filed on Oct. 21, 2020, and claims priority to Chinese Application No. 201911049482.9, filed on Oct. 31, 2019, and Chinese Application No. 201921866090.7, filed on Oct. 31, 2019, the contents of which are incorporated herein by reference in their entirety.

BACKGROUND OF DISCLOSURE

Field of the Disclosure

The present disclosure relates to the technical field of electronics, and specifically to, a display apparatus and an electronic device.

Description of the Related Art

With development of communication technology, electronic devices such as smartphones are becoming more and more popular. During use of an electronic device, the electronic device can display pictures by its display screen.

For better display effect and user experience, a dimension of the display screen is getting bigger and bigger, but the display screen of the electronic device is difficult to hold when it exceeds a certain dimension. Therefore, it is more and more important to increase a screen-to-body ratio of the display screen. In the related art, a camera is arranged under a display apparatus, and the camera acquires ambient light through the display apparatus for imaging, but light transmittance of the display apparatus in the related art is insufficient, affecting imaging quality of the camera.

SUMMARY

Embodiments of the present disclosure provide a display apparatus and an electronic device.

An embodiment of the present disclosure provides a display apparatus, which includes a first display region and a second display region adjacent to each other;
 the first display region includes a plurality of first pixels arranged in an array manner; and
 the second display region includes a plurality of regular-shape first-pixel sets and at least one second-pixel set conformal to an edge of the second display region, wherein the second-pixel set is adjacent to the first display region;
 wherein each of the first-pixel sets includes a first number of second pixels, the first number of second pixels are configured to be driven by one of first driving units, the second-pixel set includes a second number of second pixels, the second number of second pixels are configured to be driven by one second driving unit, and the second number is less than the first number.

An embodiment of the present disclosure further provides a display apparatus, which includes:
 a first display region including a plurality of first pixels;
 a second display region including a plurality of second pixels; and
 a third display region including a plurality of third pixels, wherein the third pixels within the third display region and the first pixels within the first display region have different physical structures, and the third display region is connected to the first display region and the second display region;
 wherein the second display region includes a plurality of regular-shape first-pixel sets and at least one second-pixel set conformal to an edge of the second display region, the second-pixel set is adjacent to the third display region, each of the first-pixel sets includes a first number of the second pixels, the first number of the second pixels are configured to be driven by one of first driving units, the second-pixel set includes a second number of the second pixels, the second number of the second pixels are configured to be driven by one second driving unit, and the second number is less than the first number.

An embodiment of the present disclosure also provides an electronic device, which includes a display apparatus and a camera, wherein the display apparatus includes a first display region and a second display region adjacent to each other, the first display region includes a plurality of first pixels arranged in an array manner, the second display region includes a plurality of regular-shape first-pixel sets and at least one second-pixel set conformal to an edge of the second display region, the second-pixel set is adjacent to the first display region, each of the first-pixel sets includes a first number of second pixels, the first number of second pixels are configured to be driven by one of first driving units, the second-pixel set includes a second number of second pixels, the second number of second pixels are configured to be driven by one second driving unit, the second number is less than the first number, the camera includes a lens, the lens is disposed toward the second display region, and the camera is used to acquire external light signals passing through the second display region for imaging.

BRIEF DESCRIPTION OF DRAWINGS

To illustrate technical solutions in embodiments of the present disclosure more clearly, accompanying drawings that are used in the description of the embodiments will be briefly introduced as follows.

DETAILED DESCRIPTION OF EMBODIMENTS

Embodiments of the present disclosure provide an electronic device and a display apparatus thereof. The electronic device may include a display apparatus and a camera. A lens of the camera and the display apparatus are correspondingly disposed, that is, the camera acquires external light signals passing through the display apparatus for imaging. It can be understood that light transmittance of a conventional display apparatus is relatively low, and imaging effect of the camera through the display apparatus is not good. For this reason, an embodiment of the present disclosure may configure a display apparatus in a manner of different regions.

For example, light transmittance of a portion of the display apparatus corresponding to the camera is configured to be greater than light transmittance of other positions of the display apparatus, so that imaging effect of the camera can be improved. The technical solutions in the embodiments of the present disclosure will be clearly and completely described below with reference to the accompanying drawings in embodiments of the present disclosure.

An electronic device provided in an embodiment of the present disclosure may be a mobile terminal device such as a mobile phone and a tablet computer, and may also be a game device, an augmented reality (AR) device, a virtual reality (VR) device, an in-vehicle computer, a notebook computer, a data storage apparatus, an audio playback apparatus, a video playback apparatus, a wearable device, and other devices with a display apparatus, wherein the wearable device can be a smart bracelet, smart glasses, and the like.

Figure 1:
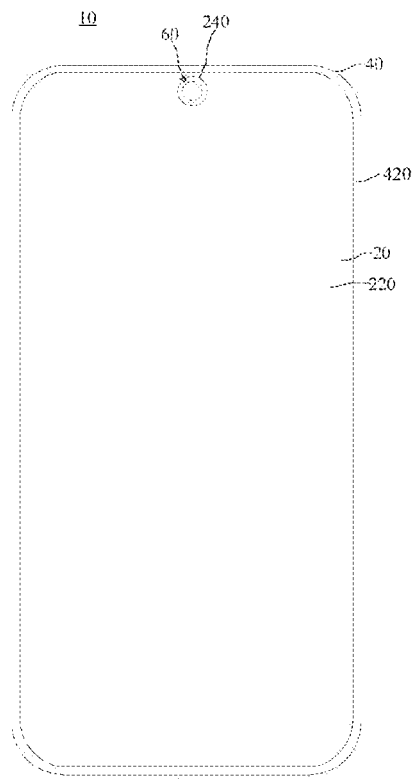
FIG. 1 is a schematic diagram of a first structure of an electronic device provided by an embodiment of the present disclosure.

Please refer to FIG. 1, which is a schematic diagram of a first structure of an electronic device provided by an embodiment of the present disclosure. FIG. 1 shows an example in which the electronic device is a mobile phone, wherein the display apparatus 20 includes a first display region 220 and a second display region 240, and the light transmittance of the second display region 240 is greater than that of the first display region 220. A camera 60 is provided in the electronic device 10, a lens of the camera 60 is disposed toward the second display region 240, wherein the camera 60 is used to acquire external light signals passing through the second display region 240 for imaging. It can also be understood that the camera 60 is disposed under the second display region 240 of the display apparatus 20, wherein the camera 60 is used to acquire the external light signals passing through the second display region 240 of the display apparatus 20 and to image according to the acquired external light signals. A display region of the display apparatus 20 is complete, and a screen ratio of the display apparatus 20 is increased. The camera 60 may be used as a front camera of the electronic device, and the camera 60 may be used to acquire images such as self-portraits of a user through the second display region 240 of the display apparatus 20.

For a more comprehensive understanding of the display apparatus of embodiments of the present disclosure. The display apparatus will be described in detail below.

Figure 2:
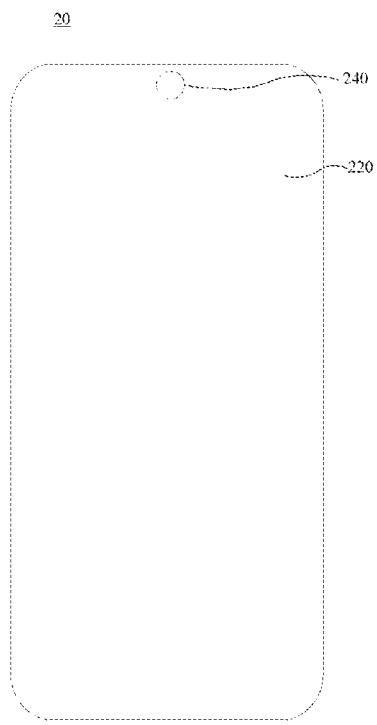
FIG. 2 is a schematic diagram of a first structure of a display apparatus provided by an embodiment of the present disclosure.

Please refer to FIG. 2, which is a schematic diagram of a first structure of a display apparatus according to an embodiment of the present disclosure. The display apparatus 20 in the embodiment of the present disclosure may include a first display region 220 and a second display region 240 adjacent to each other. Both the first display region 220 and the second display region 240 can be used to display text or images, and the first display region 220 and the second display region 240 can jointly display the same image.

For example, the first display region 220 displays a part of a preset image, and the second display region 240 displays the remaining part of the preset image. The first display region 220 and the second display region 240 may also display different images.

For example, the first display region 220 displays a preset image, and the second display region 240 displays a taskbar image. Both the first display region 220 and the second display region 240 can display contents, wherein display regions are complete, a screen ratio of the display apparatus 20 is high. The first display region 220 can surround the second display region 240, and a periphery of the second display region 240 can be both adjacent to the first display region 220, that is, the second display region 240 is located in a middle portion of the first display region 220. The first display region 220 can also partially surround the second display region 240, and a part of edges of the second display region 240 is adjacent to the first display region 220.

For example, the second display region 240 is located at a corner of the display apparatus 20 or at the middle portion of a top portion of the device 20.

Figure 3:
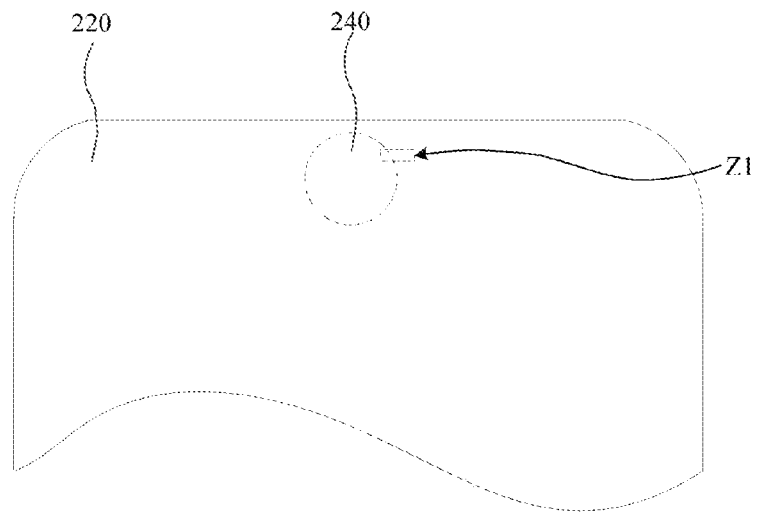
FIG. 3 is a schematic diagram of a first partial structure of a display apparatus provided by an embodiment of the present disclosure.
Figure 4:
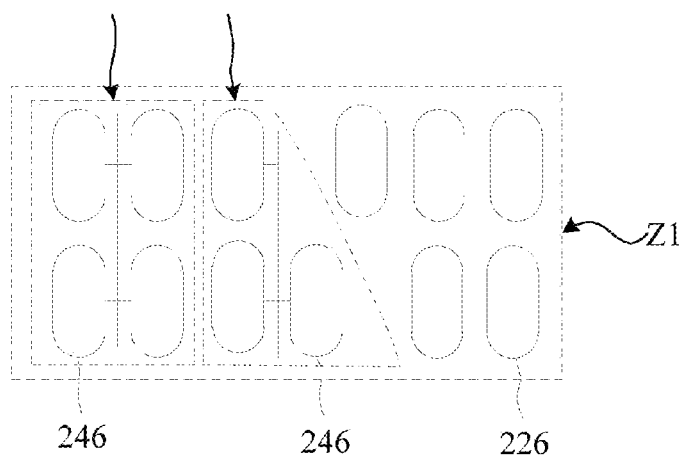
FIG. 4 is an enlarged schematic view of a Z1 portion of the display apparatus shown in FIG. 3.
Figure 5:
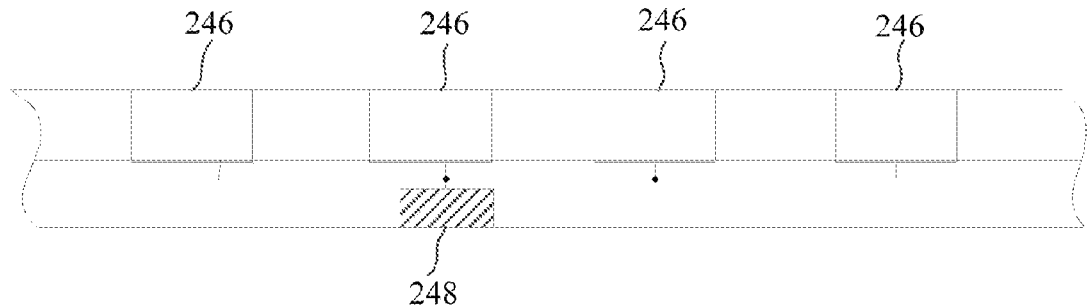
FIG. 5 is a schematic structural diagram of a first-pixel set and a first driving circuit of a display apparatus according to an embodiment of the present disclosure.

Please refer to FIGS. 3 to 5, FIG. 3 is a schematic diagram of a first partial structure of a display apparatus provided by an embodiment of the present disclosure, FIG. 4 is an enlarged schematic diagram of a Z1 portion of the display apparatus shown in FIG. 3, and FIG. 5 is a schematic structural diagram of a first-pixel set and a first driving circuit of a display apparatus according to an embodiment of the present disclosure. The first display region 220 includes a plurality of first pixels 226 arranged in an array manner, and the first display region 220 may further include a plurality of sixth driving units, wherein one of the sixth driving units drives one of the first pixels 226.

For example, the first display region 220 includes M first pixels 226 and M sixth driving units.

The second display region 240 includes a plurality of regular-shape first-pixel sets 2422, each of the first-pixel sets 2422 includes a plurality of second pixels 246, wherein all of the second pixels 246 in each of the first-pixel sets 2422 share one first driving unit 248. The plurality of second pixels in each of the first-pixel sets 2422 may be connected in parallel, so as to share one first driving unit. The plurality of second pixels in each of the first-pixel sets 2422 can also be connected in series, so as to share one first driving unit. It should be noted that a parallel connection will not change a driving voltage of the first driving unit, and a number of second pixels in each of the first-pixel sets formed in a parallel connection manner may be more than that in each of the first-pixel sets formed in a serial connection manner. A second-pixel set has the same connection as the first-pixel set.

The second display region 240 includes a plurality of regular-shape first-pixel sets 2422, each of the first-pixel sets 2422 includes a plurality of second pixels 246 connected in parallel, wherein all of the second pixels 246 in each of the first-pixel sets 2422 share one driving unit 248.

Each of the first driving units 248 is electrically connected to one of the first-pixel sets 2422, and each of the first driving units 248 is used to drive all of the second pixels 246 in one of the first-pixel sets 2422 that is electrically connected to the first driving unit. The plurality of second pixels 246 within the second display region 240 share one of the first driving units 248, so that a number of the first driving units 248 for driving the second display region 240 may be less than a number of the first pixels 226.

For example, the second display region 240 includes N first-pixel sets 2422, each of the first-pixel sets 2422 includes four second pixels 246, one of the first-pixel sets 2422 corresponds to one first driving units 248, and the second display region 240 includes 4N second pixels 246 and N first driving units 248. Compared with the first display region 220, a ratio of the first driving units 248 to the second pixels 246 disposed within the second display region 240 is smaller, and distribution density of the first driving units 248 within the second display region 240 is less than distribution density of sixth driving units 228 within the first display region 220, and each of the first driving units 248 and each of the sixth driving units both include opaque elements (such as thin-film transistors, TFT), which can make the opaque elements be included within the second display region 240 less than that within the first display region 220, so that light transmittance of the second display region 240 can be much greater than that of the first display region 220.

A shape and dimension of the second display region 240 can be set according to the camera, and an edge region between the second display region 240 and the first display region 220 needs special processing. To improve the display effect of the display apparatus, the smaller the dimension of the second display region 240, the better. The second display region 240 needs to meet requirements of the camera, so that the second display region 240 needs to correspond to a lens configuration of the camera.

For example, the second display region 240 may be circular, and the dimension of the second display region 240 is slightly greater than the lens of the camera and completely covers the lens of the camera. It can also be understood that an orthographic projection of the lens on the display apparatus is within the second display region 240. A position where the circular second display region 240 is adjacent to the first display region 220 includes an arc structure, which is not conducive to dividing the plurality of second pixels within the second display region 240 into the first-pixel sets. The second display region 240 may also be shaped as a regular shape such as an ellipse, a semi-circle, a rounded rectangle, and the like, in which an edge includes an arc-shaped structure. The second display region 240 may also be shaped as a regular shape such as a regular polygon, such as a regular hexagon, in which an edge includes an arc structure similar to a bending structure. Certainly, the second display region may also be shaped as an irregular shape with an edge including an arc structure.

Each of the regular-shape first-pixel sets 2422 within the second display region 240 includes a plurality of second pixels 246, wherein the plurality of second pixels 246 within each of the first-pixel sets can be arranged in an array manner.

For example, the second pixels 246 within each of the first-pixel sets are arranged in two rows, with two of the second pixels 246 in each row. All of the plurality of second pixels 246 within the second display region 240 can be divided into different pixel sets, but the dimension and shape of the second display region 240 need to be configured according to the camera. The edge of the second display region 240 adjacent to the first display region 220 includes an arc structure. A part of the second pixels 246 located at positions adjacent to the second display region 240 and the first display region 220 may not be within the first-pixel set arranged in a complete array. If the part of the second pixels 246 is not displayed, then there are black dots (pixels) that are not displayed between the second display region 240 and the first display region 220, wherein a transition between the second display region 240 and the first display region 220 is uneven. Therefore, to make the transition between the second display region 240 and the first display region 220 be even, it is also necessary to drive and display the part of the second pixels 246.

Specifically, the second display region 240 may include a plurality of regular-shape first-pixel sets 2422 and at least one second-pixel set 2424 that is conformal to an edge of the second display region 240. The plurality of second pixels 246 within each of the first-pixel sets 2422 are arranged in a regular shape, such as 2 rows and 2 columns, 3 rows and 3 columns, 2 rows and 3 columns, 3 rows and 2 columns, 4 rows and 4 columns, or the like. A number of second pixels 246 involved in the second-pixel set 2424 conformal to the edge of the second display region 240 is less than that in each of the first-pixel sets 2422. It can also be understood that the plurality of second pixels 246 within the second display region 240 are divided into the plurality of first-pixel sets 2422 as possible first, and the remaining ones are not enough to be divided into one regular-shape first-pixel set 2422, wherein the remaining second pixels 246 are adjacent to an edge of the second display region 240. The remaining second pixels 246 are still divided according to the original division rule and abandoned beyond the second display region 240, only the remaining parts are connected in parallel to form the second-pixel set 2424. The second-pixel set 2424 is at least one set of the second pixels 246 located at edges of the second display region 240, not within the first-pixel set 2422.

For example, the first-pixel set 2422 is arranged in 2 rows and 2 columns. In a k-th row and a (k+1)th row, the edge of the second display region 240 has one of the second pixels 246 located at the i-th column in the k-th row and two of the second pixels 246 located at the i-th and (i+1) columns in the (k+1)th row. This three of the second pixels 246 are connected in parallel to form an second-pixel set 2424 conformal to an edge of the second display region 240, wherein a number of the second pixels 246 in each row is different. It should be noted that the number and arrangement of the second pixels 246 in the second-pixel set 2424 are determined according to the edge of the second display region, and the number and arrangement of the second pixels 246 included in different second-pixel sets 2424 may also be different. The second-pixel set 2424 may include only one of the pixels 246 or may include a plurality of the second pixels 246. It should be noted that a first number may be a fixed value, such as 9 or 6, and a second number may be a value less than the first number and not fixed. The second-pixel set conformal to the edge of the second display region includes irregular edges, and the irregular edge of at least one second-pixel set is conformal to the arc structure of the second display region. It can also be understood that the second-pixel set conformal to the edge of the second display region includes an arc-shaped structure with irregular edges forming the second display region.

If the second pixels 246 within the second display region 240 have the same physical structure as the first pixels within the first display region 220, a smooth transition can be formed through the irregular transition of the second-pixel set 2424. In particular, when the edge of the second display region 240 adjacent to the first display region 220 includes an arc structure, an abrupt feeling of a linear transition and a destructive feeling of a jagged display can be avoided. A corresponding display smoothing algorithm may also be applied for the second-pixel set 2424, and display smoothing transition processing is performed on the pixels 246 of the second-pixel set 2424 to achieve a smooth transition. In addition, an algorithm applied for the first display region 220 may correspond to an algorithm applied for a part of the second pixels 246 adjacent to the first display region 220, and display smoothing transition processing is performed on a portion of the first display region 220 adjacent to the second display region 240 to achieve a smooth transition. The physical structure of each of the second pixels 246 within the second display region 240 is the same as that of each of the first pixels of the first display region 220, which can be understood as the dimension, distribution density, and arrangement of the first pixels of the first display region 220 are the same as that of the second pixels within the second display region 240.

It should be noted that the larger the volume of the pixel to be driven is, the larger the required driving capability is. Furthermore, because a thickness of each of the pixels is fixed in a display apparatus, the larger the area of the pixel is, the larger the required driving capability is. The number of the second pixels 246 included in each of the regular-shape first-pixel sets 2422 is fixed, and the corresponding driving capability thereof is also fixed. The number of the second pixels 246 included in each of the second-pixel sets 2424 conformal to the edge of the second display region 240 is not fixed, e.g., the number of the second pixels included in the second-pixel set 2424 may be 1, 2, 3, 4, and so on. Different numbers of pixels 246 correspond to different driving capabilities. Driving circuits of second driving units for driving all of the second-pixel sets 2424 may be the same.

For example, the second driving units for driving all of the second-pixel sets 2424 may be one type of 7T1C, 5T1C, or 2T1C. The driving circuits of the second driving units are the same, but the driving capability is indeed different, which can be realized by a dimension of a single element (such as one or more thin-film transistors) in the second driving unit. The larger the dimension of the thin-film transistor, the greater the driving capability thereof. Namely, the dimension of the thin-film transistor in the second driving unit electrically connected to the second-pixel set 2424 is positively correlated to the number of the second pixels 246 in the second-pixel set 2424. It can also be understood that the greater the number of the second pixels 246 in the second-pixel set 2424, the larger the dimension of the one or more thin-film transistors of the second driving unit electrically connected to the second pixels 246.

It should be noted that the first driving unit 248 for driving the first-pixel set 2422 may have the same driving circuit as the second driving unit for driving the second-pixel set 2424. The first driving unit 248 driving the first-pixel set 2422 may also have a different driving circuit from the second driving unit driving the second-pixel set 2424.

For example, the first driving unit for driving the first-pixel set 2422 is 5T1C, and the second driving unit for driving the second-pixel set 2424 is 2T1C.

Figure 6:
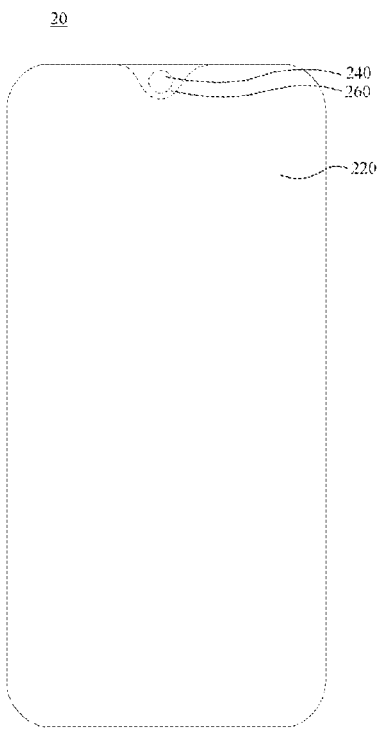
FIG. 6 is a schematic diagram of a second structure of a display apparatus provided by an embodiment of the present disclosure.
Figure 7:
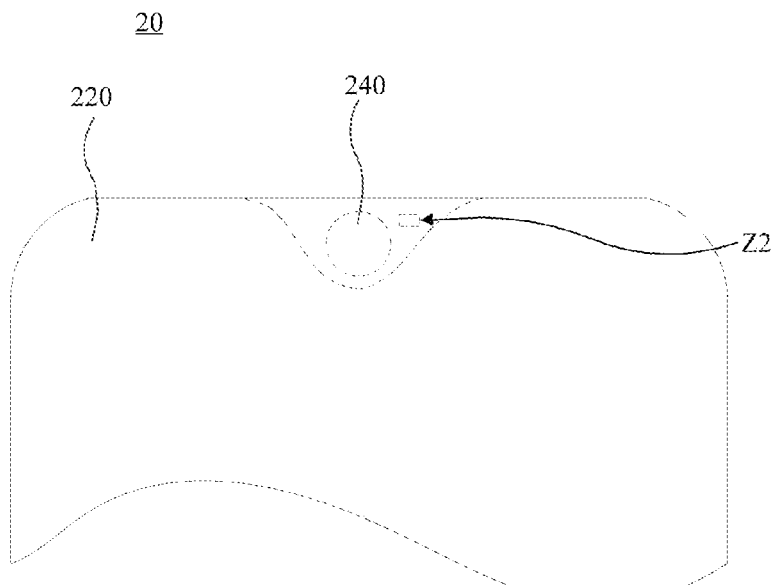
FIG. 7 is a schematic diagram of a second partial structure of a display apparatus according to an embodiment of the present disclosure.

To further improve light transmittance of the second display region, the first driving unit and the second driving unit may be disposed in other regions than the second display region. Specifically, please refer to FIGS. 6 and 7, FIG. 6 is a schematic diagram of a second structure of a display apparatus provided by an embodiment of the present disclosure, and FIG. 7 is a schematic diagram of a second partial structure of a display apparatus according to an embodiment of the present disclosure. The first display region 220 may include a third display region 260. The third display region 260 is adjacent to the second display region 240. It can also be understood that a part of the first display region 220 adjacent to the second display region 240 is configured as the third display region 260. Specifically, the third display region 260 may completely surround the second display region 240. Alternatively, the third display region 260 may partially surround the second display region 240.

For example, the third display region 260 is disposed on two sides of the second display region 240.

Figure 8:
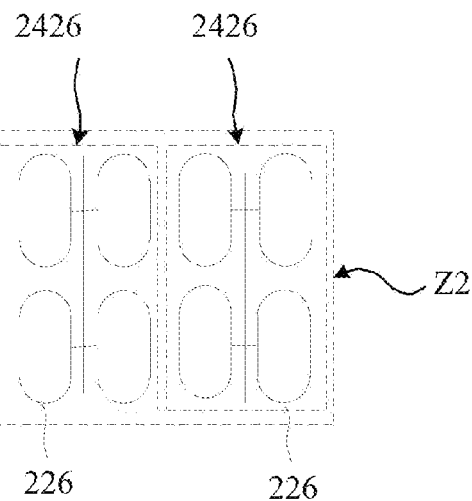
FIG. 8 is an enlarged schematic view of a Z2 portion of the display apparatus shown in FIG. 7.
Figure 9:
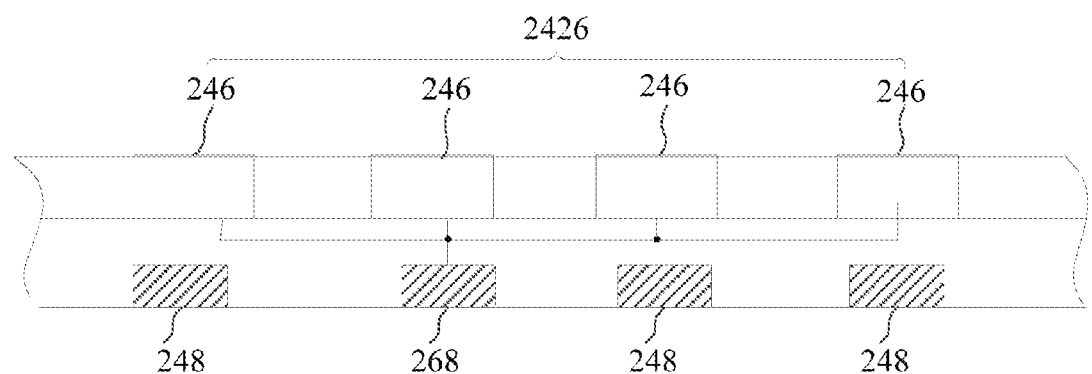
FIG. 9 is a schematic structural diagram of pixels and driving units within a third display region of a display apparatus according to an embodiment of the present disclosure.

Please refer to FIGS. 8 and 9, FIG. 8 is an enlarged schematic view of a Z2 portion of the display apparatus shown in FIG. 7, and FIG. 9 is a schematic structural diagram of pixels and driving units within a third display region of a display apparatus according to an embodiment of the present disclosure. The plurality of first driving units 248 and second driving units for driving the second pixels 246 within the second display region 240 may be disposed within the third display region 260 in addition to the second display region 240. The camera does not need to obtain external light signals through the third display region 260. A plurality of first driving units 248 and second driving units are arranged within the third display region 260, and the first driving units 248 and second driving units are not arranged within the second display region 240. The first driving units 248 and second driving units that are opaque are not arranged within the second display region 240, so that the light transmittance of the second display region 240 can be much greater than that of the first display region 220 and the third display region 260. Meanwhile, other problems caused by the first driving units 248 and second driving units are reduced, such as a diffraction problem caused by the first driving units 248 periodically arranged on the imaging of the camera, and reflection and refraction problems caused by the first driving units 248 and second driving units on the imaging of the camera.

It can be understood that the greater the distribution density of the first pixels 246 within the first display region 220 of the display apparatus 20, the more the pixels 246 within a unit area, the higher the resolution, and the better the display effect provided. Considering the production process of the display apparatus 20, the dimension of each of the first pixels 226 within the first display region 220 corresponds to that of each of the sixth driving units 228 for driving the first pixels 226. The plurality of sixth driving units 228 also require a plurality of signal lines to be connected to the driving chips of the display apparatus 20. Each of the driving chip controls each sixth driving unit 228 via the plurality of signal lines, wherein the plurality of signal lines are arranged between the plurality of sixth driving units. 228, and there is spacing between the first pixels 226, and the spacing are configured to correspond to the signal lines. Each of the signal lines has a certain line width, which needs to meet impedance requirements and product technology.

For example, density of the first pixels within the first display region 220 can reach more than 400 ppi, the dimension of each of the first pixels 226 and that of each of the sixth driving units 228 within the first display region 220 are approximately equal. Each of the sixth driving unit 228 is correspondingly disposed under one of the first pixels 226. The plurality of signal lines are arranged between the plurality of sixth driving units 228 and correspondingly arranged under the space between the first pixels 226. The sixth driving units 228 and the signal lines connected to the sixth driving units are basically cover an entire space, and it is difficult to accommodate other components. The plurality of first pixels 226 within the third display region 260 are connected in parallel to form a plurality of third-pixel sets 2426. Each of the third-pixel sets 2426 includes the pixels 246 connected in parallel with each other. All of the pixels 246 in each of the pixel sets 2426 are electrically connected to one of third driving units 268. Each of third driving units 268 can drive all of the pixels 246 in one of the third-pixel sets 2426 electrically connected to the third driving unit. It should be noted that, in this embodiment, the sixth driving units drive the first pixels within the first display region except the third display region.

If each of the third driving units 268 and each of the sixth driving units 228 are the same driving circuit, the dimension of each of the third driving units 268 is equal to or slightly greater than the dimension of each of the sixth driving unit 228, and line widths of the signal lines connecting to the third driving units 268 and connecting to the sixth driving units 228 are approximately equal, the first pixels within the third display region 260 are connected in parallel to form the third-pixel sets. In addition, each of the third-pixel sets 2426 only needs one of the third driving units 268 for driving. The dimension of each of the third driving units 268 is approximately equal to the dimension of one of the first pixels 226. The plurality of pixels 246 of each of the third-pixel sets 2426 within the third display region 260 correspond to one third driving unit 268. Therefore, a layer of the third display region 260 on which the third driving units 268 are disposed has an accommodating space, wherein the accommodating space can be used to accommodate the first driving units 248 and second driving units for driving the second pixels 246 within the second display region 240.

When the first pixels 226 and the third driving units 268 are arranged within the third display region 260, each of the third driving units 268 and one of the third-pixel sets 2426 electrically connected to the third driving unit are correspondingly disposed.

For example, each of the third driving units 268 is disposed under one of the third-pixel sets 2426 electrically connected to the third driving unit and at least partially opposite to one of the first pixels 226 in one of the third-pixel sets 2426. When the first driving units 248 and/or the second driving units are disposed, one pixel 246 in each of the third-pixel sets 2426 and one of the third driving units 268 are correspondingly disposed, and another pixel 246 in each of the third-pixel sets 2426 and one of the first driving units 248 and/or second driving units are correspondingly disposed. It can also be understood that one of the third driving units 268 and at least one first driving unit 248 or second driving unit may be disposed under one of the third-pixel sets 2426. A number of the first driving units 248 or the second driving units is set to be positively correlated with a number of the first pixels 226 in one of the third-pixel sets 2426. Exemplarily, each of the third-pixel sets 2426 includes three first pixels connected in parallel with each other, and one of the third driving units 268 and two of the first driving units 248 may be disposed under one of the third-pixel sets 2426. It should be noted that if the first driving units and the second driving units are relatively simple driving circuits (such as 2T1C), the dimensions of the first driving units and the second driving units are small, and one of the first pixels can correspond to two or more of the first driving units or second driving units.

The plurality of first driving units and second driving units may also be disposed within the second display region and the third display region as required. Exemplarily, a part of the plurality of first driving units and second driving units are disposed within the second display region, and a part of the plurality of first driving units and second driving units are arranged within the third display region.

For example, in order to facilitate the arrangement of the first driving units and the second driving units and simplify the connection of the first driving units and the second driving units to the second pixels within the second display region, a part of the first driving units and the second driving units are disposed at a perimeter of the second display region, and a part of the first driving units and the second driving units are arranged within the third display region.

Figure 10:
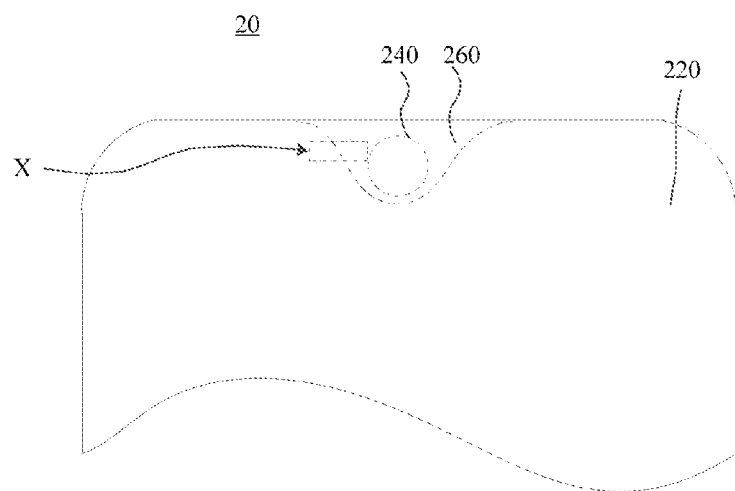
FIG. 10 is a schematic diagram of a third partial structure of a display apparatus provided by an embodiment of the present disclosure.
Figure 11:
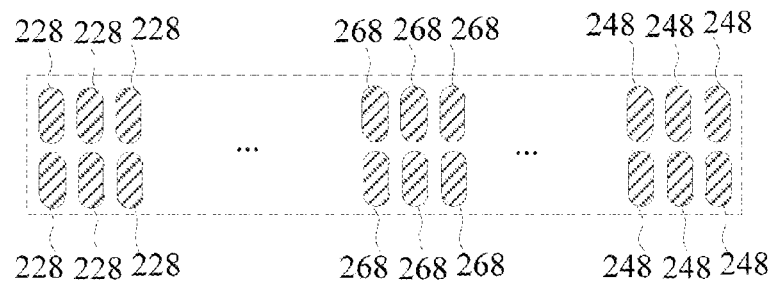
FIG. 11 is an enlarged schematic view of an X portion of the display apparatus shown in FIG. 10.

The first driving units, the second driving unit, and the third driving units disposed within the third display region may also adopt another arrangement manner. Specifically, please refer to FIGS. 10 and 11, FIG. 10 is a schematic diagram of a third partial structure of a display apparatus provided by an embodiment of the present disclosure, and FIG. 11 is an enlarged schematic view of an X portion of the display apparatus shown in FIG. 10. The plurality of third driving units 268 for driving the first pixels 226 within the third display region 260 may be centrally arranged, the plurality of third driving units 268 within the third display region 260 are centrally arranged at a position away from the second display region 24, and the plurality of first driving units and the second driving units for driving the second pixels within the second display region may be centrally arranged at a position near the second display region 240. The plurality of third driving units 268 disposed within the third display region 260 are centrally arranged between the plurality of first driving units 248 and the plurality of sixth driving units 228.

The first driving units 248 and second driving units are located under the third-pixel sets within the third display region 260 adjacent to the second display region 240, and the third driving units 268 are located under the third-pixel sets within the third display region 260 away from the second display region 240.

For example, each of the third-pixel sets has 4 pixels in parallel, four of the first driving units 248 are correspondingly arranged under one of the third-pixel sets within the third display region 260 adjacent to the second display region 240, and four of the third driving units 268 are correspondingly arranged under one of the third-pixel sets within the third display region 260 away from the second display region 240.

Because the edge of the second display region adjacent to the third display region includes arc structures, in order to smoothly transition from the second display region to the first display region or the third display region, the second display region is provided with second-pixel sets conformal to the edge of the second display region, please specifically refer to the above description, which will not be repeated here.

Figure 12:
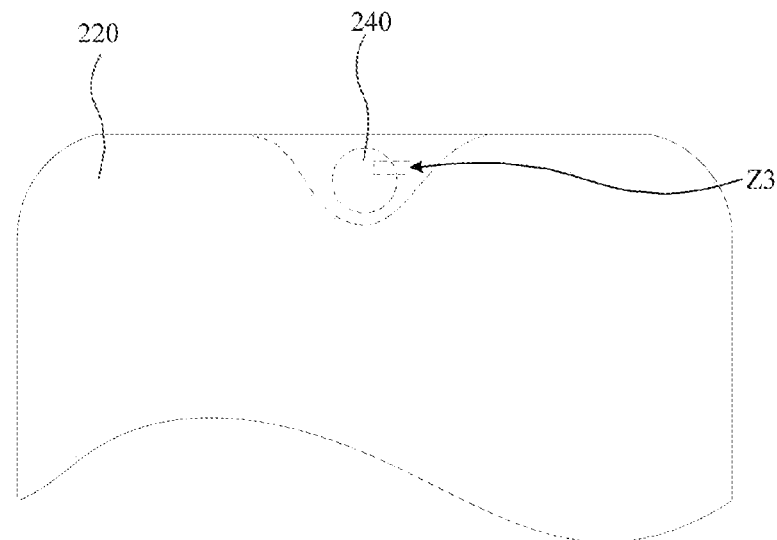
FIG. 12 is a schematic diagram of a fourth partial structure of a display apparatus provided by an embodiment of the present disclosure.
Figure 13:
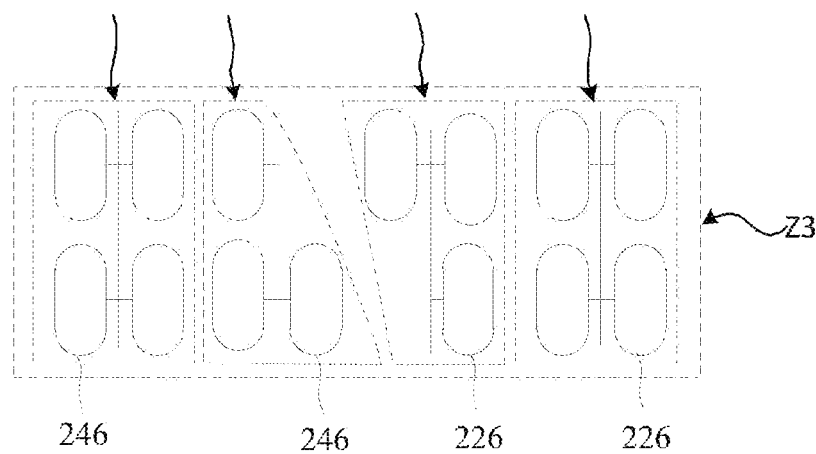
FIG. 13 is an enlarged schematic view of a Z3 portion of the display apparatus shown in FIG. 12.

In order to make that the third display region can also smoothly transition to the second display region, at least one irregular fourth-pixel set is also disposed at a position where the third display region is adjacent to the second display region. Please specifically refer to FIGS. 12 and 13, FIG. 12 is a schematic diagram of a fourth partial structure of a display apparatus provided by an embodiment of the present disclosure, and FIG. 13 is an enlarged schematic view of a Z3 portion of the display apparatus shown in FIG. 12. Fourth-pixel sets 2428 are adjacent to the second display region 240; all of the first pixels 226 in each fourth-pixel set 2428 are electrically connected to one fourth driving unit; each of the third-pixel sets 2426 includes a third number of the first pixels 226 connected in parallel with each other, and each of the third-pixel sets is a regular pixel set. The irregular fourth-pixel set 2428 includes a fourth number of the first pixels 226 connected in parallel with each other, wherein the fourth number is less than the third number. It should be noted that the third number may be a fixed value, such as 9 or 6, and the fourth number may be a non-fixed value less than the third number.

The third number of first pixels 226 in each of the regular third-pixel set 2426 are arranged in a regular shape, such as an arrangement of 2 rows and 2 columns, an arrangement of 3 rows and 3 columns, an arrangement of 2 rows and 3 columns, an arrangement of 3 rows and 2 columns, an arrangement of 4 rows and 4 columns, or the like. The number of the first pixels 226 included in the fourth-pixel set 2428 is less than that in the third-pixel set 2426. It can also be understood that the plurality of first pixels 226 within the third display region 260 are first divided to form the plurality of third-pixel sets 2426, and the remaining first pixels that are not enough to be divided to form a complete third-pixel set are divided to form at least one fourth-pixel set 2428, and the remaining first pixels 226 are adjacent to the edge of the second display region 240. The remaining first pixels 226 are still divided according to the original division rules, in which some are abandoned beyond the third display region 260, only the remaining parts are connected in parallel to form the fourth-pixel set 2428. The fourth-pixel set 2428 is a set of the first pixels 226 which locate at the edge of the third display region 260 and do not locate in the third-pixel set 2426.

It should be noted that the number and arrangement of the first pixels 226 in the fourth-pixel set 2428 are determined according to the edge of the third display region, and the number and arrangement of the first pixels 226 included in different fourth-pixel sets 2428 may also be different. The fourth-pixel set 2428 may include only one first pixel 226 or may include a plurality of first pixels 226.

Because the physical structures of the first pixel within the third display region 260 and the second pixels within the second display region 240 may be completely consistent, a smooth transition between the second-pixel sets 2426 within the second display region 240 and the fourth-pixel set 2428 within the third display region 260 can be formed. Especially, when the edge of the second display region 240 includes arc-shaped structures, the abrupt feeling of the straight-line transition and the destructive feeling of the jagged display can be avoided. Corresponding display smoothing algorithms may also be set for the second-pixel sets 2426 and the fourth-pixel set 2428, and display smoothing transition processing is performed on the pixels 246 of the second-pixel sets 2426 and the fourth-pixel set 2428 to achieve a smooth transition.

The third number of the first pixels in the third-pixel set 2426 may be equal to the first number of the second pixels in the first-pixel set 2422. The numbers of pixels in the first-pixel set 2422 and the third-pixel set 2426 are the same, and the first-pixel set 2422 and the third-pixel set 2426 adopt the same parallel mode, so that the parallel mode can be simplified.

The third number of the first pixels in the third-pixel set 2426 may also be less than the first number of the second pixels in the first-pixel set 2422. The third display region 260 does not need to be used for the camera to obtain external light signals, the number of pixels 246 in the third-pixel set 2426 is less than that in the first-pixel set 2422, and the display effect of the third display region 260 may be better than that of the second display region 240, wherein an area of the first display region other than the third display region has the best display effect. By the transition from the third display region 260 to the second display region 240, the sudden change of the display effect is reduced.

The third number of the first pixels 226 in the third-pixel set 2426 may also be greater than the first number of second pixels 246 in the first-pixel set 2422. The third display region 260 does not need to be used for the camera to obtain external light signals. The number of first pixels 226 in the third-pixel set 2426 is greater than the number of second pixels in the first-pixel set 2422, and the third display region 260 can be set smaller to reduce an area of an abnormal display region.

The third display region 260 may also not be provided with a set of pixels, that is, each of the first pixels within the third display region 260 is electrically connected to one of the third driving units, and each of the third driving units corresponds to one of the first pixels within the third display region, and at least one of the first pixels within the third display region also corresponds to the first driving unit or the second driving unit. In order to accommodate the first driving units and the second driving units within the third display region, the third driving unit within the third display region can use a relatively simple driving circuit, such as 5T1C, 2T1C, or other driving circuits. In this way, one layer on which the third display region is provided with the third driving units has accommodation spaces, wherein the accommodation spaces can be used to accommodate the first driving units and the second driving units. In order to conveniently dispose the first driving units and the second driving units within the third display region, the first driving unit and the second driving unit may also use relatively simple driving circuits, such as 5T1C, 2T1C, or other driving circuits 248 and second driving units. The first pixels within the first display region other than the third display region may adopt a driving circuit with a more complex and better effect than the third driving circuit, such as a 7T1C driving circuit and the like. In addition, in order to accommodate the first driving unit and the second driving unit in the third display region, the dimension of the first pixel in the third display region can also be made larger, and the dimension of the first pixel in the third display region is greater than the corresponding driving circuit, so, a plurality of first pixels in the third display region jointly accommodate a first driving unit.

For example, one of the first pixels within the third display region corresponds to one of the second driving units, meanwhile, one first driving unit or one second driving unit is accommodated between four first pixels.

It should be noted that the first driving unit may adopt a simpler driving circuit than that of the third driving unit, that is, a number of thin-film transistors involved in one first driving unit may be less than a number of thin-film transistors involved in one third driving unit.

For example, the first driving unit is 2T1C, and the third driving unit is 5T1C. For better light transmittance within the second display region, and for better disposing the first driving unit within the third display region, the first driving unit adopts the simplest driving circuit. In order to better accommodate the first driving units within the third display region and to ensure the display effect of the third display region, the third driving circuits adopt driving circuits with better effect than the first driving units and simpler than sixth driving circuits. In order to simplify the disposing of the driving units, the first driving units and the second driving units may have the same driving circuits, and the third driving units and the fourth driving units may have the same driving circuits.

It should be noted that the first display region 220 in the embodiment of the present disclosure may be an actively driven (AMOLED) display region, and the second display region 240 may be an actively driven (AMOLED) display region or a passively driven (PMOLED) display region. An area of the second display region 240 is much less than that of the first display region 220, the first display region 220 may be used as a main display region of the display apparatus, and the second display region 240 may be used as an auxiliary display region of the display apparatus. Although the display effect of PMOLED is lower than that of AMOLED, because the area of the second display region is small, the displayed content is also very small, and the second display region 240 can be located at the edge of the display apparatus, and the displayed content is less important, so the first second display region 240 may adopt PMOLED. The passively driven second display region 240 only needs one thin-film transistor (TFT) for driving, and the number of opaque thin-film transistors is very small, which can greatly improve the light transmittance of the second display region 240. Certainly, in order to make that the display effect of the second display region 240 to be close to that of the first display region 220, the second display region 240 may also be actively driven (AMOLED). The third display region 260 may select an actively driven (AMOLED) display region or a passively driven (PMOLED) display region as required.

Figure 14:
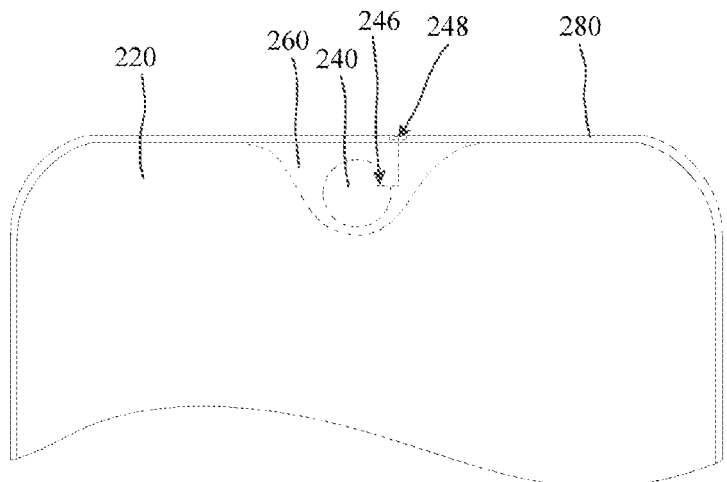
FIG. 14 is a schematic diagram of a fifth partial structure of a display apparatus provided by an embodiment of the present disclosure.

In addition to being disposed in the display region of the display apparatus, the first driving unit may also be disposed in a non-display region outside the display region. Please specifically refer to FIG. 14, which is a schematic diagram of a fifth partial structure of a display apparatus provided by an embodiment of the present disclosure. The display apparatus 20 may further include a non-display region 280. The first driving units 248 and second driving units for driving the pixels 246 within the second display region 240 may also be disposed within the non-display region 280. The display apparatus 20 may be a full screen, that is, the front of the display apparatus 20 is basically a display region, and when viewed from the front of the electronic device, the front of the display apparatus 20 is basically equal to the display surface of the electronic device. However, even if it is a full-screen display apparatus 20, there is still a non-display region at the edge of the display apparatus 20. The non-display region can be understood as a black border of the display apparatus 20, and the width of the black border can be made very narrow, such as the width of the black border less than 1 mm or 0.5 mm, and the like. Because the area of the second display region 240 is small, the number of the second pixels 246 within the second display region 240 is also less, the plurality of second pixels 246 within the second display region 240 are connected in parallel, and the first driving units 248 and second driving units for driving the second pixels 246 within the second display region 240 are also less, the first driving units 248 and second driving units can be arranged at positions in the black border to improve the light transmittance of the second display region 240 without affecting the first display region 220 or the third display region 260. The second pixel 246 corresponding to the second display region 240 needs to be provided with the plurality of first driving units 248 and second driving units. All of the plurality of first driving units 248 and second driving units can be arranged at the positions in the black border. In order to better accommodate all of the first driving units 248 and second driving units at the positions in the black border, simpler first driving units 248 and second driving units can be used.

For example, each of the first driving units 248 and second driving units can use a driving circuit such as 2T1C, 5T1C, and the like, so that the number of thin-film transistors (TFTs) in each of the first driving units 248 and second driving units is less, and the space required by a single first driving units 248 and second driving units is relatively small. The distribution density of the second pixels 246 within the second display region 240 may also be configured to be lower, so that a total number of the first driving units 248 and second driving units within the second display region 240 is less. It should be noted that the plurality of first driving units 248 and the plurality of second driving units may also be partially disposed within the non-display region 280 and partially disposed within the second display region 240 or the third display region 260. If the second display region adopts PMOLED, each of the driving units within the second display region has only one TFT, which can be disposed within the non-display region. The non-display region may or may not be adjacent to the second display region. If the non-display region can be adjacent to the second display region, the first driving unit may be conveniently disposed within the non-display region.

The plurality of second pixels within the second display region may be arranged in a manner of pixel units. Please specifically refer to FIG. 15, which is a schematic diagram of a first structure of second pixels within a second display region in a display apparatus according to an embodiment of the present disclosure. The plurality of second pixels 246 within the second display region may be divided into a plurality of pixel units 244. The second display region includes the plurality of pixel units 244, and each of the pixel units 244 includes at least three of the second pixels 246 with different colors. One of the pixel units 244 within the second display region can display mixed colors, and one of the pixel units 244 can display a desired color as required.

For example, one of the pixel units 244 includes a second pixel 246 with three colors of R, G, and B, which can display various colors, such as red, green, blue, white, pink, and cyan, as required. The second pixels 246 with the same color as at least two of the pixel units 244 within the second display region are connected in parallel to form a pixel set 2422.

For example, four pixel units 244 may form three first-pixel sets 2422. Specifically, four red pixels 246 are connected in parallel to form a first-pixel set 2422, four green pixels 246 are connected in parallel to form a first-pixel set 2422, and four blue pixels 246 are connected in parallel to form a first-pixel set 2422, so that the four pixel units 244 form one display unit. It should be noted that a pixel unit may also include pixels with multiple colors such as "R, G, B, and W," or "R, G, B, and Y."

The parallel connection of the second pixels 246 may be formed by the direct connection of the second pixels 246.

For example, the plurality of second pixels 246 are connected in parallel via materials the same as their materials or connected in parallel via connection lines of other materials. The second pixels 246 can also be connected in parallel in other ways. Specifically, the second display region further includes a plurality of metal anodes, one of the second pixels 246 is correspondingly disposed and electrically connected to one of the metal anodes, and the parallel connection of the second pixels can be realized by the parallel connection of the metal anodes. Certainly, the plurality of second pixels 246 connected in parallel in one of the first-pixel sets 2422 may be the plurality of second pixels 246 with the same color.

For example, the second pixels 246 of one of the first-pixel sets 2422 are all red pixels or green pixels, or blue pixels.

The second display region includes gate lines (not shown in the figure) and data lines. The gate lines, the data lines, and the first driving units cooperate to drive each of the second pixels 246. The gate lines and the data lines may be arranged in different layers and arranged in a staggered manner.

For example, the gate lines are arranged in rows and the data lines are arranged in columns. The arrangement of the second pixels 246 within the second display region may be one of a standard RGB arrangement, a Pentile arrangement, or a Delta arrangement. It should be noted that the data lines and the second pixels 246 are not located on the same layer.

Figure 15:
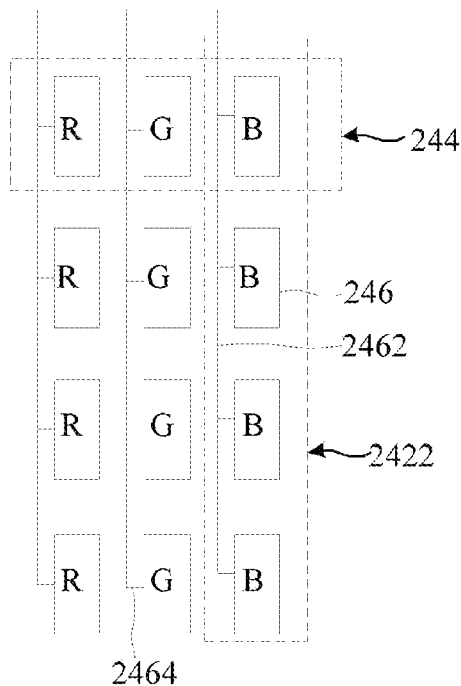
FIG. 15 is a schematic diagram of a first structure of second pixels within a second display region in a display apparatus according to an embodiment of the present disclosure.
Figure 16:
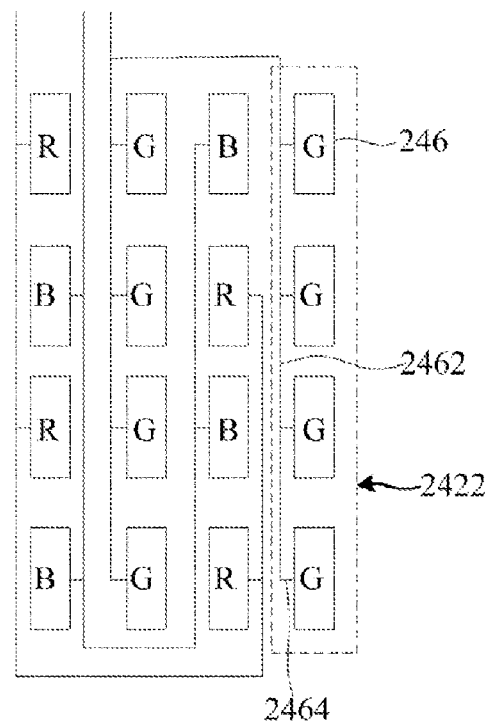
FIG. 16 is a schematic diagram of a second structure of second pixels within a second display region in a display apparatus provided by an embodiment of the present disclosure.

When the plurality of second pixels 246 with the same color that are connected in parallel are parallel to the data lines and arranged in columns, one of first driving signal lines 2462 is provided between two columns of the second pixels 246 and electrically connected to the second pixels 246 via second driving signal lines 2464 parallel to the first driving signal lines 2462. Different pixel arrangement modes have different parallel modes, as shown in FIGS. 15 and 16.

Figure 17:
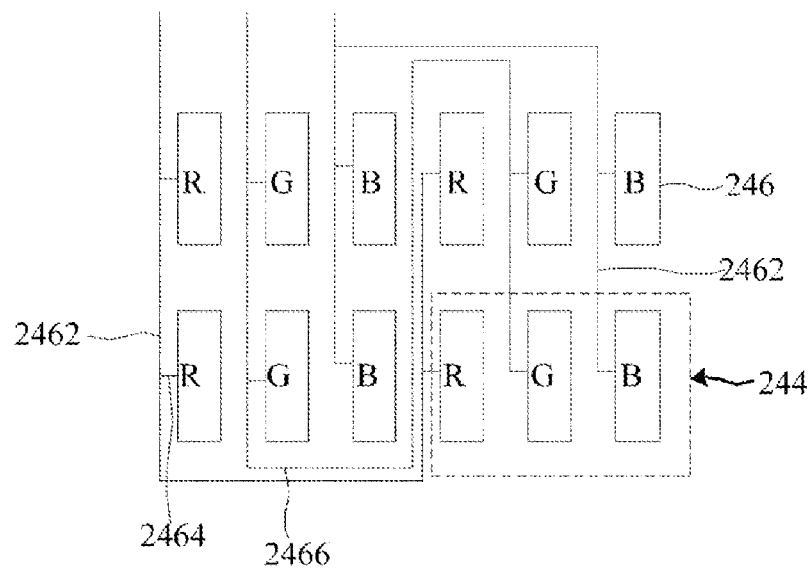
FIG. 17 is a schematic diagram of a third structure of second pixels within a second display region in a display apparatus according to an embodiment of the present disclosure.
Figure 18:
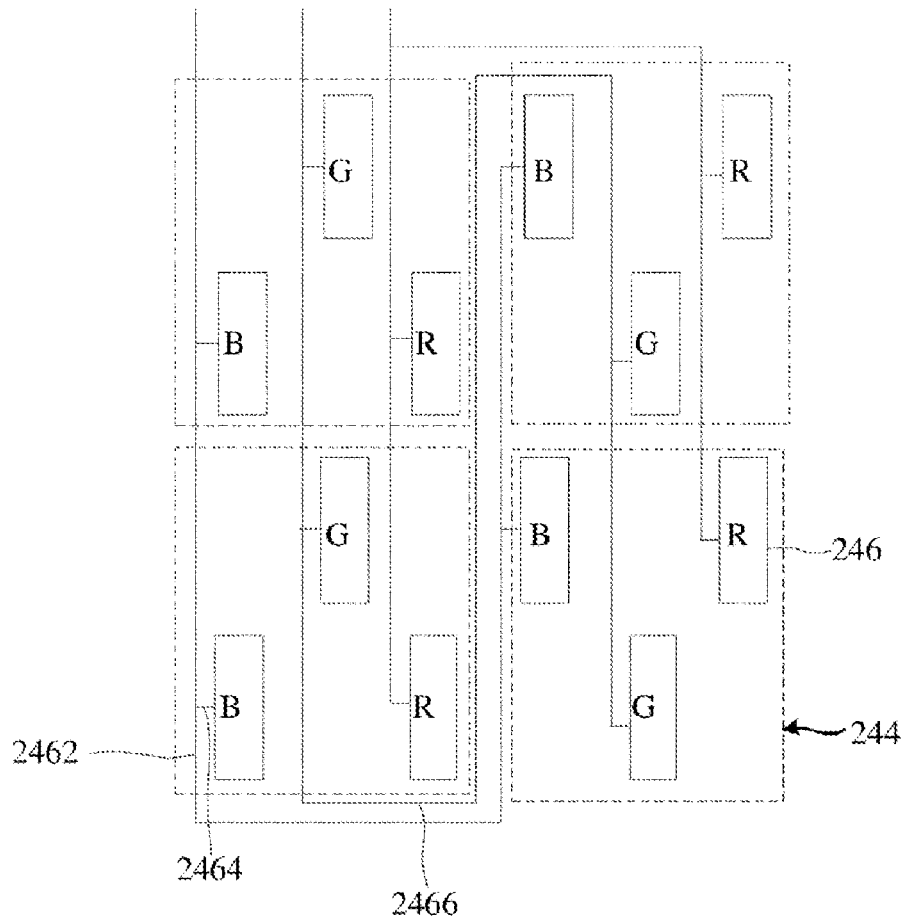
FIG. 18 is a schematic diagram of a fourth structure of second pixels within a second display region in a display apparatus provided by an embodiment of the present disclosure.

When a plurality of pixel arrays with the same color that are connected in parallel are arranged, the pixels have different parallel modes. Please specifically refer to FIGS. 17 and 18, FIG. 17 is a schematic diagram of a third structure of second pixels within a second display region in a display apparatus according to an embodiment of the present disclosure, and FIG. 18 is a schematic diagram of a fourth structure of second pixels within a second display region in a display apparatus provided by an embodiment of the present disclosure. When the plurality of second pixels 246 with the same color in parallel are arranged in an array manner, adjacent two of the second pixels 246 with the same color that are parallel to a direction of the data lines are connected in parallel via one of the first driving signal lines 2462, the first driving signal lines 2462 are parallel to the data lines, and the adjacent second pixels 246 with the same color that are perpendicular to the direction of the data lines are connected in parallel via the second driving signal lines 2464, wherein the second driving signal lines 2464 connecting the second pixels 246 with different colors are arranged at intervals.

For ease of understanding, FIGS. 17 and 18 are used as examples for illustration. FIG. 17 shows a schematic diagram of the standard RGB arrangement of the pixels 246 within the second display region, and FIG. 18 shows a schematic diagram of the Delta arrangement of the second pixels 246 within the second display region. The plurality of second pixels 246 are arranged in an array manner, and the second pixels 246 with the same color R, G, or B are arranged in an array manner. One of the first driving signal lines 2462 is arranged next to adjacent two of the second pixels with the same color in the column and are connected in parallel to the second driving signal lines 2464 which are perpendicular to the first driving signal line. Specifically, one of the first driving signal lines 2462 is provided next to the second pixels with the same color adjacent in the column and is connected in parallel to the second driving signal lines 2464 which are perpendicular to the first driving signal line. Among the second pixels with the same color that are adjacent in the row, a B type of second pixels directly connect, at one end, two of the first driving signal lines 2462 in parallel; an R type of second pixels directly connect, at another end, two of the first driving signal lines 2462 in parallel; and a G type of second pixels are connected in parallel via a third driving signal line 2466, wherein the third driving signal line 2466 bypasses the B type of second pixels and the R type of second pixels disposed between the two columns of the G type of second pixels and separates the driving signal lines connecting the R type of second pixels. It should be noted that the arrangement of the second pixels within the second display region according to the pentiles may also adopt a similar parallel manner, which will not be repeated here.

Figure 19:
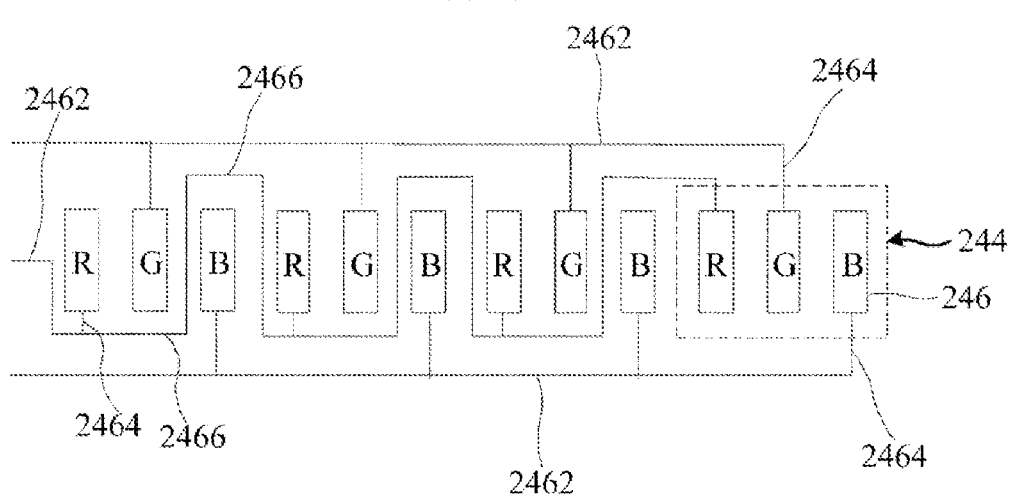
FIG. 19 is a schematic diagram of a fifth structure of second pixels within a second display region in a display apparatus provided by an embodiment of the present disclosure.

When the plurality of second pixels with the same color that are connected in parallel are perpendicular to the data lines, the second pixels are connected in different parallel manners. Please specifically refer to FIG. 19, which is a schematic diagram of a fifth structure of second pixels within a second display region in a display apparatus provided by an embodiment of the present disclosure. The arrangement of the second pixels 246 within the second display region is a standard RGB arrangement or a Pentile arrangement. The plurality of second pixels 246 with the same color that are connected in parallel are perpendicular to the data lines, the first driving signal lines 2462 are arranged along a direction perpendicular to the data lines, and the first driving signal lines 2462 are electrically connected to the second pixel 246 via the second driving signal lines 2464 perpendicular to the first driving signal lines 2462, wherein the second driving signal lines connecting the second pixels 246 with different colors are arranged at intervals. For ease of understanding, the following takes FIG. 19 as an example for a detailed description. one of the first driving signal lines 2462 is arranged on each of two sides of the plurality of second pixels 246 with the same color, and one of the first driving signal lines 2462 is arranged in a middle position. The plurality of G type of second pixels 246 are electrically connected to the first driving signal lines 2462 via a plurality of second driving signal lines 2464 perpendicular to the first driving signal lines 2462, so as to realize the parallel connection of the plurality of G type of second pixels. The plurality of B type of second pixels 246 are connected in parallel in a connection manner similar to the G type of second pixels 246. The first driving signal lines 2462 electrically connected to the plurality of R type of second pixels 246 are arranged at an end portion. The second display region also includes the third driving signal lines 2466 to which the plurality of R type of second pixels 246 are connected in parallel. The third driving signal lines 2466 bypass the driving signal electrically connected to the G type of second pixel 246 and the B type of pixel 246 to connect the plurality of R type of second pixels 246 in parallel. Specifically, the third driving signal lines 2466 bypass the G type of second pixel 246 on one side opposite to the second driving signal lines 2464 connected to the G type of second pixels 246 and bypass the B type of second pixel 246 on one side opposite to the second driving signal lines 2464 connected to the B type of second pixels 246 in the same manner. It should be noted that the pixels within the second display region may be arranged in a Pentile arrangement in a similar parallel manner, which will not be repeated here.

In addition to the parallel connection of the second pixels with the same color in different pixel units to form one pixel set, the second pixels in one pixel unit and the second pixels in at least one of other pixel units may also be connected in parallel to form one pixel set.

For example, the R type of second pixels of one pixel unit are connected to the G type of second pixels and the B type of second pixels of another pixel unit in parallel to form one pixel set. For another example, the R type of second pixels of one pixel unit are connected to the G type of second pixels of another pixel unit and the B type of second pixels of a third pixel unit in parallel to form one pixel set. A mixed color display can be performed as required.

For example, if the second display region displays a specific icon, the second pixels within the second display region can be connected in parallel according to the specific icon.

Figure 20:
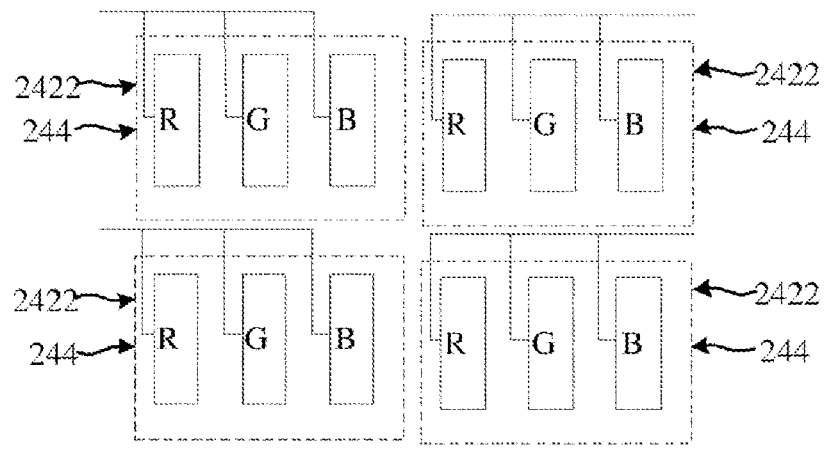
FIG. 20 is a schematic diagram of a sixth structure of second pixels within a second display region in a display apparatus provided by an embodiment of the present disclosure.

In addition, the pixel set may also be formed by connecting at least two second pixels with different colors in parallel in the same pixel unit. As shown in FIG. 20, the R type of second pixels, the B type of second pixels, and the G type of second pixels in the pixel sets 244 are connected in parallel to form first-pixel sets 2422. A mixed color display can be performed as required.

For example, if the second display region displays a specific icon, the second pixels within the second display region can be connected in parallel according to the specific icon.

For example, the second display region displays a signal icon (4G, 5G, WIFI, etc.), an alarm clock icon, and the like. The second display region only needs to display a white or black alarm clock icon or the like. It should be noted that only the second pixels with two colors may be connected in parallel, and the second pixels with the other color may be driven independently.

Figure 21:
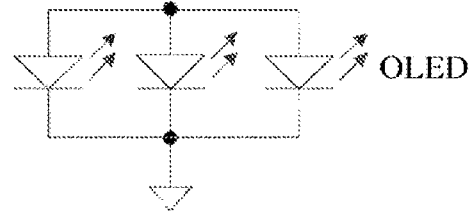
FIG. 21 is a schematic circuit diagram of a plurality of second pixels in parallel within a second display region in a display apparatus provided by an embodiment of the present disclosure.

For ease of understanding, the following description is given by taking the first driving circuit as 2T1C as an example. Please specifically refer to FIG. 21, which is a schematic circuit diagram of a plurality of second pixels in parallel within a second display region in a display apparatus provided by an embodiment of the present disclosure. In which, VDADA is a data line, SEL can be understood as a gate line, VDD is a power supply line, and OLED are pixels. The figure shows an embodiment in which three second pixels are connected in parallel. It can be understood that other numbers of pixels, such as 2, 4, 9, 16, and the like, can be connected in parallel as required. It should be noted that the parallel connection of the plurality of first pixels within the third display region can be performed in the same manner as the parallel connection of the plurality of second pixels within the second display region, which will not be repeated here.

Figure 22:
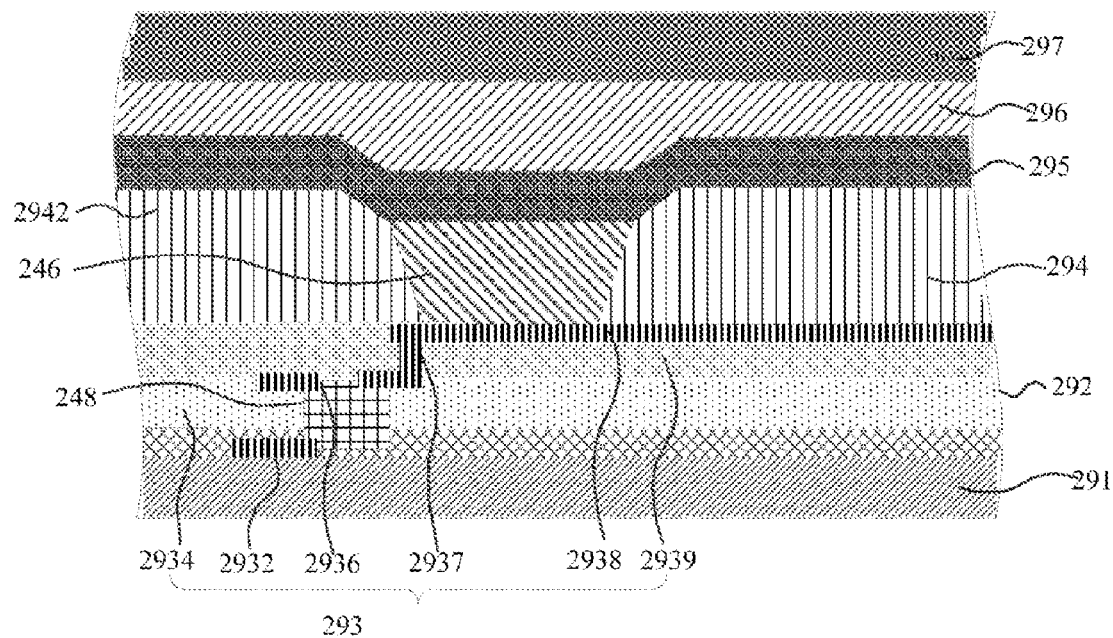
FIG. 22 is a schematic diagram of a stacked structure within a second display region in a display apparatus provided by an embodiment of the present disclosure.

For a more comprehensive understanding of the display apparatus according to the embodiment of the present disclosure, please refer to FIG. 22, which is a schematic diagram of a stacked structure within a second display region in a display apparatus provided by an embodiment of the present disclosure. The second display region of the display apparatus includes a substrate 291, a driving circuit layer 292, an anode layer 293, a light-emitting layer 294, a common electrode layer 295, a planarization layer 296, and a touch control layer 297 that are stacked in sequence.

The substrate 291 can be used as a supporting platform for the display apparatus, and the substrate 291 can be made of glass or plastic or resin, or other materials.

For example, the material of the substrate 291 can be polyimide (PI).

The driving circuit layer 292 is disposed on the substrate 291. The driving circuit layer 292 includes the first driving units 248 for driving the second pixels 246 within the second display region. Each of the first driving units 248 includes at least one thin-film transistor TFT. A source and a drain of the thin-film transistor are located in the same layer, and a gate is located between the source and the light-emitting layer.

The anode layer 293 is disposed on the driving circuit layer 292, the anode layer 293 includes a first anode layer 2932, a first insulation layer 2934, and a second anode layer 2936, wherein the first insulation layer 2934 is disposed between the first anode layer 2932 and the second anode layer 2936 to separate and insulate the first anode layer 2932 and the second anode layer 2936. The first anode layer 2932 includes first signal lines (gate lines) in a first direction, the second anode layer 2936 includes second signal lines (data lines) in a second direction. The first direction and the second direction may be perpendicularly arranged. Each of the first signal lines and the second signal lines is electrically connected to the first driving unit 248. The driving chip of the display apparatus controls the first driving unit 248 via the first signal line and the second signal line. The first signal lines and the second signal lines can use ITO with high light transmittance to ensure the transmittance of the second display region, and meanwhile, the diffraction caused by the first signal lines and the second signal lines can be reduced. The first signal lines and the gate of each of the first driving units can be located in the same layer, and the second signal lines may be electrically connected to the drain of each of the first driving units 248 via a conductive portion located in a first via hole 2935. The anode layer 293 may further include a metal anode layer. The metal anode layer is adjacent to the light-emitting layer 294. The metal anode 2938 of the metal anode layer and the first pixel 226 of the light-emitting layer 294 are directly adjacent and electrically connected. There is a second insulation layer 2939 between the metal anode layer and the source of the first driving unit 248, wherein the metal anode 2938 can be electrically connected to the source of the first driving unit 248 via a conductive portion located in the pixel via hole. The metal anode 2938 can also use ITO with high light transmission.

It should be noted that, in some other embodiments, the metal anode in the metal anode layer and the second signal lines in the second anode layer can be located on the same layer. Namely, the metal anode layer and the second anode layer are located in the same layer, and the first insulation layer and the second insulation layer can be the same layer; the metal anode in the metal anode layer and the second anode layer can also be located in different layers, and the metal anode layer and the second anode layer are separated and insulated by the second insulation layer.

The light-emitting layer 294 is disposed on the anode layer 293. The light-emitting layer 294 includes a pixel definition layer 2942. The pixel definition layer 2942 has a plurality of pixel holes. Each pixel hole is provided with one first pixel 226. The first pixel 226 includes an organic light-emitting material.

The common electrode layer 295 is disposed on the light-emitting layer 294. The anode layer 293 and the common electrode layer 295 are disposed on two sides of the first pixel 226 and jointly drive the first pixel 226. The common electrode layer 295 may adopt an ITO material with high light transmittance.

A planarization layer 296 may also be disposed on the common electrode layer 295. After the first pixel 226 is disposed in the pixel hole, the first pixel 226 does not fill up the pixel hole. After the common electrode layer 295 is disposed on the first pixel 226, a groove will appear. The planarization layer 296 can fill in the grooves and cover the entire light-emitting layer 294 to protect the light-emitting layer 294 and the like.

The touch layer 297 may also be disposed on the planarization layer 296. The touch layer 297 may be used to detect a user's touch operation.

A polarizer (not shown in the figure) may also be provided on the touch layer 297, and the polarizer may be used to prevent internal light from being transmitted out, and prevent the user from seeing the internal components such as the driving units. The touch layer 297 and the polarizer can be pasted together and then disposed on the planarization layer 296.

It should be noted that, in some other embodiments, some structures may be added or removed as required, which is not limited to this embodiment of the present disclosure.

For example, at least one of the touch layer 297 and the polarizer can be reduced. For another example, a protective layer can be added between the planarization layer 296 and the touch layer 297, and the protective layer can be made of the same material as the substrate 291.

All layers within the second display region except the driving circuit layer 292 are made of light-transmitting materials, so as to improve the light transmittance of the second display region.

For example, all of the substrate 291, the pixel definition layer 2942, the common electrode layer 295, the planarization layer 296, and the touch layer 297 within the second display region can be made of light-transmitting materials, and the signal lines in the anode layer 293 can be made of ITO or light-transmitting materials such as nanosilver. The TFTs of the driving circuit layer 292 cannot adopt light-transmitting materials, and parts of the driving circuit layer 292 other than the TFTs can also adopt light-transmitting materials. It can be understood that the solution of improving the second display region by improving the light transmittance of the material and changing the wiring arrangement is involved within the scope of the present disclosure.

It should be noted that the first display region may adopt a layered structure similar to that of the second display region. Specifically, please refer to the above-mentioned embodiments, which will not be repeated here. At least one of the substrate, the pixel definition layer, the common electrode layer, the planarization layer, the touch layer, and the like within the first display region can be made of the same light-transmitting material as that within the second display region. Exemplarily, the substrate can be made of light-transmitting materials such as glass or resin, and the common electrode layer can be made of ITO material. At least one of the substrate, the pixel definition layer, the common electrode layer, the planarization layer, the touch layer, and the like within the first display region can be made of different materials from the second display region.

For example, the signal lines in the anode layer within the first display region can be made of metal or alloy materials such as molybdenum, molybdenum aluminium molybdenum, and Ag, and the metal anode within the first display region can be made of metal materials, such as Mg, Ag, and Al. The common electrode layer within the first display region can be made of Mg, Ag, and other materials. The common electrode layer within the first display region and the common electrode layer within the second display region are connected at the edges to jointly form a complete common electrode layer.

The display apparatus further includes a polarizer. The polarizer may have a first polarizer portion corresponding to the second display region. The first polarizer portion may be one or more through holes or light-transmitting material.

For example, a through hole is firstly defined corresponding to the second display region, and then a transparent material is filled in the through hole to form the first polarizing portion. For another example, a through hole is firstly defined corresponding to the second display region, and then a material with high light transmittance and low polarization is filled in the through hole to form the first polarizing portion, so that the first polarizing portion can not only realize the function of high light transmittance but also achieve functions of preventing light from being reflected and allowing users to see the internal structure.

The stacked structure within the second display region may also be other structures, which are not limited to this embodiment of the present disclosure.

Figure 23:
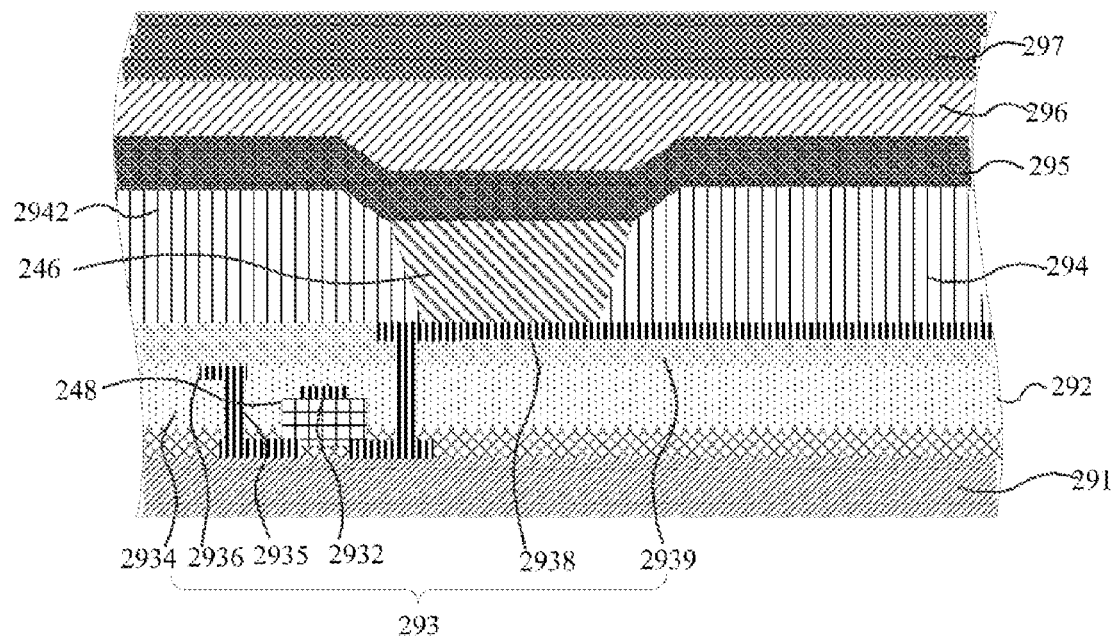
FIG. 23 is a schematic diagram of another stacked structure within a second display region in a display apparatus provided by an embodiment of the present disclosure.

Exemplarily, in some other embodiments, please refer to FIG. 23, which is a schematic diagram of another stacked structure within a second display region in a display apparatus provided by an embodiment of the present disclosure. The main difference between the stacked structure within the second display region in this embodiment and the above-mentioned embodiment lies in the driving circuit layer and the anode layer. The source and the drain of the thin-film transistor of the first driving unit within the second display region are located in the same layer, and the source is located between the gate and the light-emitting layer.

The anode layer 293 is partially disposed on the driving circuit layer 292. The anode layer 293 includes a first anode layer 2932, a first insulation layer 2934, and a second anode layer 2936. The first insulation layer 2934 is disposed between the first anode layer 2932 and the second anode layer 2936 to separate and insulate the first anode layer 2932 and the second anode layer 2936. The first anode layer 2932 includes first signal lines (gate lines) in a first direction. The second anode layer 2936 includes second signal lines (data lines) in a second direction. The first direction and the second direction can be perpendicularly arranged. Each of the first signal lines and the second signal lines is electrically connected to a first driving unit 248. A driving chip of the display apparatus controls the first driving unit 248 via the first signal lines and the second signal lines. The first signal lines and the gate in each of the first driving units 248 may be located in the same layer. The second signal lines and the drain in each of the first driving units 248 may be located in the same layer. The anode layer 293 may further include a metal anode layer 2938. The metal anode layer 2938 is adjacent to the light-emitting layer 294. The metal anode of the metal anode layer 2938 and the first pixel 226 of the light-emitting layer 294 are directly adjacent and electrically connected. A second insulation layer 2939 is provided between the metal anode layer 2938 and the source of each of the driving units 248. The metal anode can be electrically connected to the source of each of the first driving units 248 via a pixel via 2937. A light-blocking block 280 is disposed on the second insulation layer 2939 between the metal anode layer 2938 and the second anode layer 2936.

It should be noted that the above layered structure shows an embodiment in which each of the first driving units is located within the second display region.

In some other embodiments, each of the first driving units is not arranged within the second display region but is disposed on the driving circuit layer within the third display region. The layered structure of the third display region including the third driving units is similar to the layered structure in the figure. The layered structure of the third display region including the third driving units is similar to the layered structure of the above-mentioned embodiment. The stacked structure of each of the second driving units is the same as that of each of the first driving units. The stacked structure of each of the fourth driving units is the same as that of each of the third driving units, which will not be repeated here.

Figure 24:
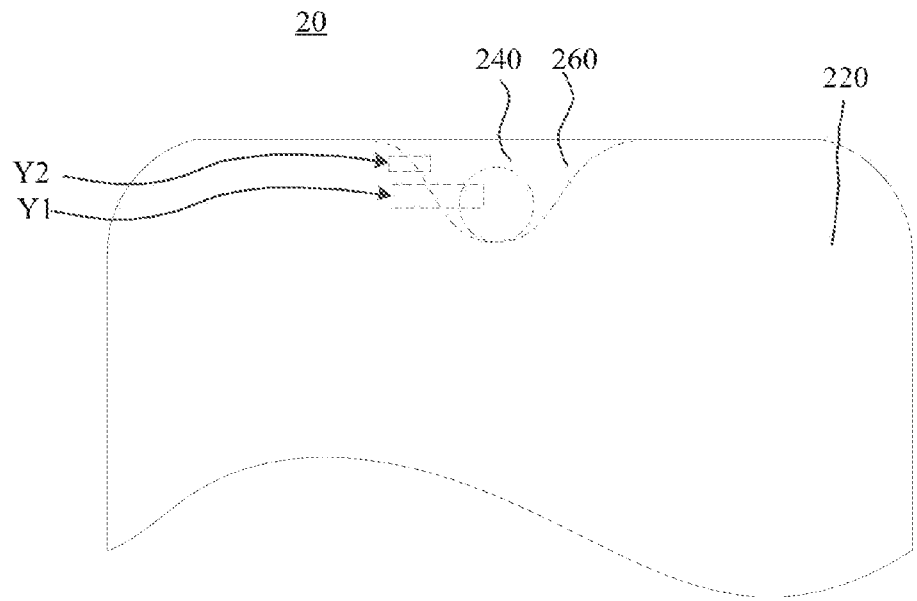
FIG. 24 is a schematic diagram of a sixth partial structure of a display apparatus provided by an embodiment of the present disclosure.
Figure 25:
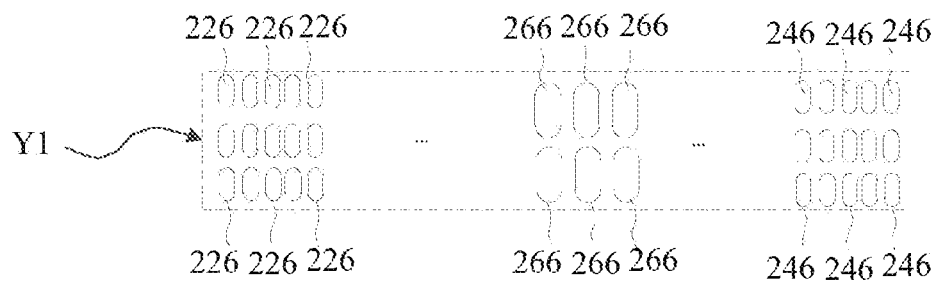
FIG. 25 is an enlarged schematic view of a Y1 portion of a display apparatus shown in FIG. 24.

An embodiment of the present disclosure further provides a display apparatus. The main difference between the display apparatus in this embodiment and the display apparatus in the foregoing embodiments lies in the first display region and pixels of the display apparatus. Please specifically refer to FIGS. 24 and 25, FIG. 24 is a schematic diagram of a sixth partial structure of a display apparatus provided by an embodiment of the present disclosure, and FIG. 25 is an enlarged schematic view of a Y1 portion of a display apparatus shown in FIG. 24. It can be understood that the first display region in this embodiment can be understood as an area of the first display region other than the third display region in the above-mentioned embodiment.

The first display region 220 includes a plurality of first pixels 226; the second display region 240 includes a plurality of second pixels 246, and the physical structures of the second pixels 246 and the first pixels 226 are the same; the third display region 260 includes a plurality of third pixels 246, the physical structures of the pixels 266 within the third display region 260 and the first pixels 226 within the first display region 220 are different, and the third display region 260 connects the first display region 220 and the second display region 240. The first display region 220, the second display region 240, and the third display region 260 may be referred to the above embodiments, and details are not described herein again. The main difference is that the physical structures of each of the first pixels 226 and each of the second pixels 246 are the same but different from the physical structure of each of the third pixels 266. The distribution density of the third pixels 266 is less than that of the first pixels 226 and the second pixels 246. The dimension of each of the third pixels 266 may be greater than the dimension of each of the first pixels 226, and spacing distance between pixels is positively correlated with the dimension. Namely, the larger the pixel dimension, the larger the spacing distance between pixels, and the smaller the distribution density. Namely, the distribution density of the third pixels 266 is less than the distribution density of the first pixels 226. The dimension of each of the third pixels 266 may be the same as the dimension of each of the first pixels but the distance between the third pixels 266 is greater than the distance between the first pixels, so that the distribution density of the third pixels 266 is less than that of the first pixels 226. The first pixels and the second pixels that have the same physical structure can be formed in the same process.

The second display region includes a plurality of regular-shape first-pixel sets and at least one second-pixel set conformal to an edge of the second display region, the second-pixel set is adjacent to the third display region, all of the second pixels in the first-pixel set share one of first driver units, and all of the second pixels in the second-pixel set share one of second driving units; the first-pixel set includes a first number of second pixels, the second-pixel set includes a second number of second pixels, and the second number is less than the first number. The specific structures of the first-pixel set and the second-pixel set may be referred to the foregoing embodiments, and details are not described herein again.

The plurality of second pixels in the first-pixel set may also be connected in series, so as to share one first driving unit. It should be noted that the parallel connection will not change the driving voltage of each of the first driving units, and the number of the second pixels in the first-pixel set formed by parallel connection may be more than that in the first-pixel set formed by serial connection. The second-pixel set has the same connection as the first-pixel set.

The third display region includes a plurality of third-pixel sets, each third-pixel set includes a plurality of third pixels connected in parallel, all of the third pixels in each third-pixel set share one of third driving units for driving, and the first driving unit and the second driving unit are disposed within the third display region. The specific structure of the third-pixel set may be referred to the foregoing embodiments, and details are not described herein again.

The third display region may further include a plurality of regular third-pixel sets and at least one irregular fourth-pixel set, the fourth-pixel set is adjacent to the second display region, and all of the pixels in the third-pixel set share a third driver unit, all of the third pixels in the fourth-pixel set share a fourth driving unit; each of the third-pixel sets is a regular pixel set, the third-pixel set includes a third number of third pixels in parallel with each other, and the fourth-pixel set includes a fourth number of third pixels connected in parallel with each other, wherein the fourth number is less than the third number. The third number may be less than or equal to the first number. Specific structures of the third-pixel sets and the fourth-pixel set may be referred to the foregoing embodiments, and details are not described here again.

Figure 26:
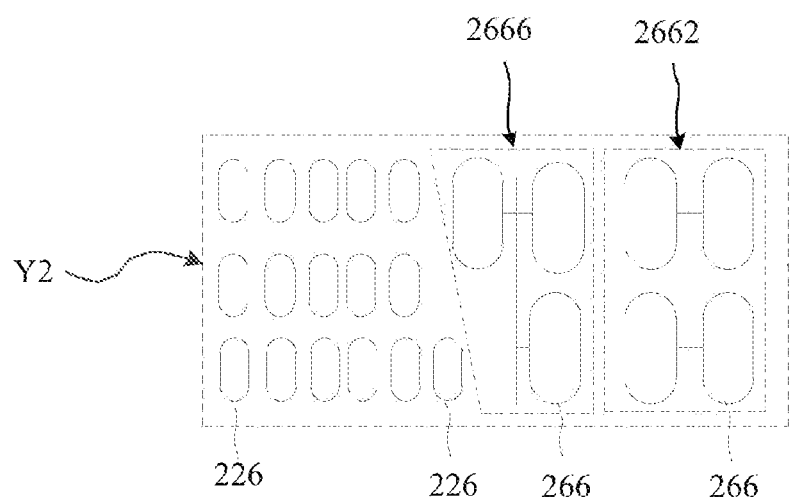
FIG. 26 is an enlarged schematic view of a Y2 portion of a display apparatus shown in FIG. 24.

Please refer to FIG. 26, which is an enlarged schematic view of a Y2 portion of a display apparatus shown in FIG. 24. The third display region 260 may further include at least one irregular fifth-pixel set 2666 and fifth driving unit corresponding to the fifth-pixel set in quantity, the fifth-pixel sets 2666 are adjacent to the first display region 220, each fifth-pixel set 2666 includes a fifth number of third pixels 266 connected in parallel with each other, all of the third pixels 266 in each fifth-pixel set 2666 share a fifth driving unit for driving, and the fifth number of the third pixel 266 in each of the fifth-pixel sets 2666 is less than the third number of third pixels 266 in each of the third sets of pixels 2662. The specific structure of the fifth-pixel set may be the same as that of the fourth-pixel set, and details are not described herein. It should be noted that the third display region 260 may be provided with the fourth-pixel set and the fifth-pixel set 2666 as required.

For example, if the edges of the third display region 260 and the first display region 220 include arc structures, the third display region 260 includes the fifth-pixel set 2666, and if the edges of the third display region and the second display region include arc structures, the third display region includes the fourth-pixel set. It can also be understood that the third display region may include the fourth-pixel set or the fifth-pixel set, and may also include the fourth-pixel set and the fifth-pixel set.

The parallel structures of pixels in each of the first-pixel set, the second-pixel set, the third-pixel set, the fourth-pixel set, and the fifth-pixel set in this embodiment may be referred to as the parallel structure of the first-pixel set in the above-mentioned embodiment, which is not repeatedly described here.

Figure 27:
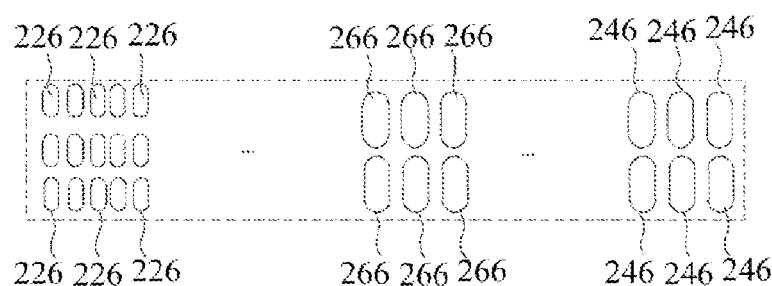
FIG. 27 is another enlarged schematic view of the Y1 portion of the display apparatus shown in FIG. 24.

Please refer to FIG. 27, which is another enlarged schematic view of the Y1 portion of the display apparatus shown in FIG. 24. This embodiment and the above-mentioned embodiments mainly lie in the physical structure of the second pixel within the second display region. The physical structures of the third pixels within the third display region are the same as that of the second pixel within the second display region and are different from the physical structure of the first pixel within the first display region. The parallel structure of pixels within the second display region and the third display region may be referred to the parallel structure of the above-mentioned embodiment, and details are not described here.

Figure 28:
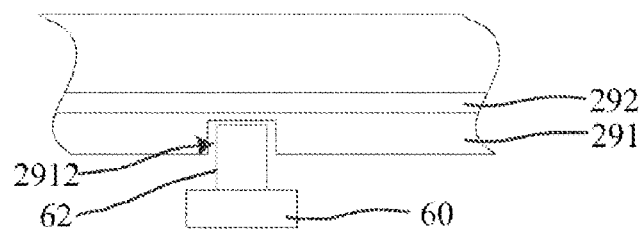
FIG. 28 is a schematic diagram of a first structure of a display apparatus and a camera provided by an embodiment of the present disclosure.

A lens of a camera in an electronic device faces the substrate of the display apparatus, wherein the camera is used to acquire external light signal passing through the first display region for imaging. In order to reduce the space occupied by the camera, the lens of the camera may be close to or adjacent to the substrate of the display apparatus. The substrate of the display apparatus is mainly used to carry other layer structures of the display apparatus and does not need any special function itself. Because the camera part can be arranged in the substrate, in order to further reduce the space occupied by the camera. Please specifically refer to FIG. 28, which is a schematic diagram of a first structure of a display apparatus and a camera provided by an embodiment of the present disclosure. A first mounting hole 2912 is defined at a position of the substrate corresponding to the camera 60, and the camera 60 is at least partially mounted in the first mounting hole 2912. The first mounting hole 2912 can be a blind hole, that is, the thickness of a part of the substrate 291 relative to the camera 60 is less than that of the other parts, and the substrate 291 is still a complete substrate 291, which does not affect its function of carrying other layer structures of the display apparatus 20, and Part of the space can be freed up to accommodate the camera 60. The installation manner of the first installation hole 2912 and the camera head 60 can be set according to the dimension of the first installation hole 2912 and the dimension of the camera head 60. Exemplarily, if the space of the first installation hole 2912 is insufficient to install of the entire camera 60, the lens 62 of the camera 60 is partially arranged in the first installation hole 2912. If the camera head 60 is small enough, the entire camera head 60 is disposed in the first mounting hole 2912.

Figure 29:
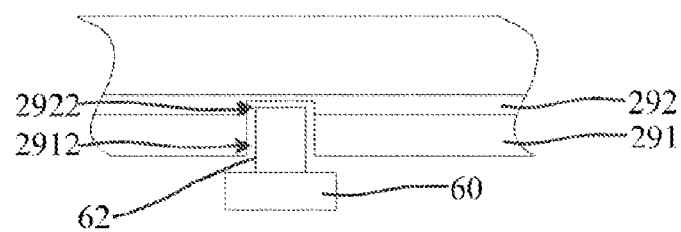
FIG. 29 is a schematic diagram of a second structure of a display apparatus and a camera provided by an embodiment of the present disclosure.

Because the driving circuit layer within the second display region is not provided with the first driving unit, and the driving circuit layer has no special function, the camera can be installed in the driving circuit layer. Please specifically refer to FIG. 29, which is a schematic diagram of a second structure of a display apparatus and a camera provided by an embodiment of the present disclosure. The first mounting hole 2912 is a through hole, the driving unit layer within the second display region 240 has a second mounting hole 2922 corresponding to the camera 60, the first mounting hole 2912 and the second mounting hole 2922 communicate with each other, and the camera 60 may be at least partially located in the second mounting hole 2922 inside the mounting hole 2922.

For example, the lens 62 of the camera 60 is located in the first mounting hole 2912 and the second mounting hole 2922. The second mounting hole 2922 may be a through hole or a blind hole. The first mounting hole 2912 and the second mounting hole 2922 may be fabricated after the partial laminated structure of the display apparatus 20 is formed.

For example, after all of the driving circuit layer, the anode layer, the light-emitting layer, and the common electrode layer of the display apparatus 20 are disposed on the substrate 291, the first mounting hole 2912 and the second mounting hole 2922 are formed corresponding to the position of the lens 62 of the camera 60 by using a laser or other means.

It should be noted that the camera 60 within the second display region 240 can be used as the front camera 60 of the electronic device. The front camera is generally a camera whose lens cannot be moved. The substrate 291 and the driving circuit layer 292 of the display apparatus can be provided with a first installation Hole 2912 and second mounting hole 2922, the camera 60 corresponding to the second display region 240 can be a camera 60 with a movable lens 62, wherein the lens 62 of the camera 60 can be moved to realize functions such as auto focus.

It can be understood that, in any of the above embodiments, the dimension and shape of the second pixel within the second display region can be configured as required.

For example, the second pixel may be shaped as a rectangle shape or a circle-like shape. The circle-like second pixel may be shaped as a circle shape, an ellipse shape, a rounded rectangle shape, or the like. The round-like second pixel can improve the diffraction problem of the second display region because the edge is an arc-shaped transition.

The display apparatus may have a regular shape, such as a rectangle, a rectangle with rounded corners, or a circle.

Certainly, in some other possible embodiments, the display apparatus may also have an irregular shape, which is not limited to this embodiment of the present disclosure.

One camera or a plurality of cameras may be arranged under the second display region. The plurality of cameras can be cameras that cooperate with each other, such as two identical cameras, a normal camera and a blur camera or a black and white camera, and the like. In addition to cameras, other functional devices can be configured under the second display region, such as proximity sensors, light sensors, ranging sensors, fingerprint recognition sensors, and the like.

For a more comprehensive understanding of the electronic device of the embodiments of the present disclosure. The structure of the electronic device will be further described below. Please continue to refer to FIG. 1, the electronic device 10 further includes a housing 40 and a camera 60.

The housing 40 may include a back cover (not shown in the figure) and a frame 420, and the frame 420 is disposed around a periphery of the back cover. The display apparatus 20 may be disposed within the frame 420, and the display apparatus 20 and the back cover may serve as two opposite sides of the electronic device 10. The camera 60 is disposed between the rear cover of the housing 40 and the display apparatus 20. The display apparatus 20 may be an organic light-emitting diode (OLED) display apparatus 20. The display apparatus 20 may be a full screen, that is, basically the entire display surface of the display apparatus 20 is a display region. A cover plate may also be provided on the display apparatus 20. The cover plate covers the display apparatus 20 to protect the display apparatus 20 and prevent the display apparatus 20 from being scratched or damaged by water. The cover plate may be a transparent glass cover plate, so that the user can observe the information displayed by the display apparatus 20 through the cover plate.

For example, the cover plate may be a cover plate made of sapphire.

Electronic devices may also include circuit boards, batteries, and midplanes. The frame 420 is disposed around the middle plate, wherein the frame 420 and the middle plate may form a middle frame of the electronic device 10. The middle board and the frame 420 each form an accommodating cavity on both sides of the middle board, wherein one of the accommodating cavities is used for accommodating the display apparatus 20, and the other accommodating cavity is used for accommodating the circuit board, the battery and other electronic components or functional components of the electronic device 10.

The middle plate can be a thin plate-like or flake-like structure, and can also be a hollow frame structure. The middle frame is used to provide support for the electronic components or functional components in the electronic device 10, so as to mount the electronic components and functional components in the electronic device 10 together. Each of the functional components such as the camera 60, a receiver, and a battery of the electronic device 10 can be mounted on the middle frame or the circuit board for fixing. It can be understood that the material of the middle frame may include metal or plastic.

The circuit board can be mounted on the middle frame. The circuit board may be a main board of the electronic device 10. One or more functional components such as a microphone, a speaker, a receiver, an earphone interface, an acceleration sensor, a gyroscope, and a processor may be integrated on the circuit board. Meanwhile, the display apparatus 20 may be electrically connected to the circuit board to control the display of the display apparatus 20 by a processor on the circuit board. The display apparatus 20 and the camera 60 can both be electrically connected to the processor; when the processor receives a photographing instruction, the processor controls the second display region to turn off the display and controls the camera 60 to capture images through the second display region 240; when the processor does not receive a photographing instruction and receives an image display instruction, the processor controls the first display region 220 and the second display region 240 to jointly display an image.

The battery can be mounted on the middle frame. Meanwhile, the battery is electrically connected to the circuit board to enable the battery to power the electronic device 10. A power management circuit may be provided on the circuit board. The power management circuit is used to distribute the voltage provided by the battery to the various electronic components in the electronic device 10.

It should be understood that references herein to "a plurality" mean two or more.

The electronic device and the method for controlling a decorative lens provided by embodiments of the present disclosure have been described in detail above. The principles and implementations of the present disclosure are described herein by using specific examples, and the descriptions of the above embodiments are only used to help the understanding of the present disclosure. Meanwhile, for those skilled in the art, according to the idea of the present disclosure, there will be changes in the specific embodiments and application scope. In summary, the content of this specification should not be construed as a limitation to the present disclosure.

What is claimed is:

1. A display apparatus, comprising a first display region and a second display region adjacent to each other;
   the first display region comprising a plurality of first pixels arranged in an array manner; and
   the second display region comprising a plurality of regular-shape first-pixel sets and at least one second-pixel set conformal to an edge of the second display region, wherein the second-pixel set is adjacent to the first display region, the second-pixel set comprises an irregular edge, an edge of the second display region adjacent to the first display region comprises an arc-shaped structure, and the arc-shaped structure is conformal to the irregular edge of the second-pixel set;
   wherein each of the first-pixel sets comprises a first number of second pixels, the first number of second pixels are configured to be electrically connected to and driven by one of first driving units, the second-pixel set comprises a second number of second pixels, the second number of second pixels are configured to be electrically connected to and driven by one second driving unit, and the second number is less than the first number.

2. The display apparatus of claim 1, wherein the first number of second pixels in each of the first-pixel sets are connected in parallel, and the second number of second pixels in each second-pixel set are connected in parallel.

3. The display apparatus of claim 1, wherein the display apparatus further comprises a third display region, the third display region is formed within the first display region, the third display region is adjacent to the second display region, the third display region comprises a plurality of third-pixel sets, each of the third-pixel sets comprises a plurality of the first pixels, all of the first pixels in each of the third-pixel sets are configured to be driven by one of third driving units, and the first driving units and the second driving unit are disposed within the third display region.

4. The display apparatus of claim 3, wherein the third-pixel sets are regular pixel sets, and each of the third-pixel sets comprises a third number of the first pixels connected in parallel with each other; and
wherein the third display region further comprises at least one irregular fourth-pixel set and fourth driving unit corresponding to the fourth-pixel set in quantity, the fourth-pixel set is adjacent to the second display region, the fourth-pixel set comprises a fourth number of the first pixels connected in parallel with each other, all of the first pixels within each of the fourth-pixel sets are configured to be driven by the fourth driving unit, and the fourth number is less than the third number.

5. The display apparatus of claim 4, wherein the first pixels within the third display region and the second pixels within the second display region have a same physical structure, and the third number is less than or equal to the first number.

6. The display apparatus of claim 4, wherein a number of thin-film transistors involved in each of the first driving units is less than a number of thin-film transistors involved in each of the third driving units.

7. The display apparatus of claim 6, wherein each of the first driving units and the second driving unit has a same driving circuit, and each of the third driving units and the fourth driving unit has a same driving circuit.

8. The display apparatus of claim 3, wherein one of the first pixels in the third-pixel set and one of the third driving units are correspondingly disposed, and another of the first pixels and one of the first driving units or the second driving unit are correspondingly disposed.

9. The display apparatus of claim 1, wherein the display apparatus further comprises a third display region, the third display region is formed within the first display region, the third display region is adjacent to the second display region, the third display region comprises a plurality of third driving units, and one of the third driving units is electrically connected to one of the first pixels within the third display region; and
wherein distribution density of the first pixels within the third display region is less than distribution density of the second pixels within the second display region, each of the third driving units and one of the first pixels within the third display region are correspondingly disposed, and at least one of the first pixels within the third display region and the first driving units or the second driving unit are also correspondingly disposed.

10. The display apparatus of claim 1, wherein the second display region further comprises a plurality of metal anodes, each of the second pixels and one of the metal anodes are correspondingly disposed and electrically connected, and at least two of the second pixels in each of the first-pixel sets or the second-pixel set are connected in parallel via the metal anodes.

11. The display apparatus of claim 1, wherein a plurality of the second pixels connected in parallel in each of the first-pixel sets or the second-pixel set are pixels with the same color.

12. The display apparatus of claim 1, wherein the pixels within the second display region are driven in a passive manner, and the pixels within the first display region are driven in an active manner.

13. A display apparatus, comprising:
a first display region comprising a plurality of first pixels;
a second display region comprising a plurality of second pixels; and
a third display region comprising a plurality of third pixels, wherein the third pixels within the third display region and the first pixels within the first display region have different physical structures, and the third display region is connected to the first display region and the second display region;
wherein the second display region comprises a plurality of regular-shape first-pixel sets and at least one second-pixel set conformal to an edge of the second display region, the second-pixel set is adjacent to the third display region, each of the first-pixel sets comprises a first number of the second pixels, the first number of the second pixels are configured to be electrically connected to and driven by one of first driving units, the second-pixel set comprises a second number of the second pixels, the second number of the second pixels are configured to be electrically connected to and driven by one second driving unit, and the second number is less than the first number.

14. The display apparatus of claim 13, wherein the first number of the second pixels in each of the first-pixel sets are connected in parallel, and the second number of the second pixels in each second-pixel set are connected in parallel.

15. The display apparatus of claim 13, wherein the third display region comprises a plurality of third-pixel sets, each of the third-pixel sets comprises a plurality of the third pixels connected in parallel, all of the third pixels in each of the third-pixel sets are configured to be driven by one of the third driving units, and the first driving units and the second driving unit are disposed within the third display region.

16. The display apparatus of claim 15, wherein the third-pixel sets are regular pixel sets, and each of the third-pixel sets comprises a third number of the third pixels connected in parallel with each other; and
wherein the third display region further comprises at least one irregular fourth-pixel set and fourth driving unit corresponding to the fourth-pixel set in quantity, the fourth-pixel set is adjacent to the second display region, each fourth-pixel set comprises a fourth number of the third pixels connected in parallel with each other, and all of the third pixels in each of the fourth-pixel sets are configured to be driven by the fourth driving unit, and the fourth number is less than the third number.

17. The display apparatus of claim 15, wherein the third-pixel sets are regular pixel sets, and each of the third-pixel sets comprises a third number of the third pixels connected in parallel with each other; and
wherein the third display region further comprises at least one irregular fifth-pixel set and fifth driving unit corresponding to the fifth-pixel set in quantity, the fifth-pixel set is adjacent to the first display region, each fifth-pixel set comprises a fifth number of the third pixels connected in parallel with each other, all of the third pixels in each fifth-pixel set are configured to be driven by the fifth driving unit, and the fifth number is less than the third number.

18. The display apparatus of claim 15, wherein the third display region comprises a plurality of third driving units, and one of the third driving units is electrically connected to one of the third pixels within the third display region; and wherein distribution density of the third pixels within the third display region is less than distribution density of the second pixels within the second display region, each of the third driving units and one of the first pixels within the third display region are correspondingly disposed, and at least one of the third pixels within the third display region and the first driving units or the second driving unit are also correspondingly disposed.

19. An electronic device, comprising a display apparatus and a camera, wherein the display apparatus comprises a first display region and a second display region adjacent to each other, the first display region comprises a plurality of first pixels arranged in an array manner, the second display region comprises a plurality of regular-shape first-pixel sets and at least one second-pixel set conformal to an edge of the second display region, the second-pixel set is adjacent to the first display region, the second-pixel set comprises an irregular edge, an edge of the second display region adjacent to the first display region comprises an arc-shaped structure, the arc-shaped structure is conformal to the irregular edge of the second-pixel set, each of the first-pixel sets comprises a first number of second pixels, the first number of second pixels are configured to be electrically connected to and driven by one of first driving units, the second-pixel set comprises a second number of second pixels, the second number of second pixels are configured to be electrically connected to and driven driven by one second driving unit, the second number is less than the first number, the camera comprises a lens, the lens is disposed toward the second display region, and the camera is configured to acquire external light signals passing through the second display region for imaging.

* * * * *